(12) United States Patent
Park et al.

(10) Patent No.: US 8,736,009 B2
(45) Date of Patent: May 27, 2014

(54) IMAGE SENSOR AND METHOD OF FABRICATING THE SAME

(71) Applicants: Byung Jun Park, Gyeonggi-do (KR); Yong Woo Lee, Gyeonggi-do (KR); Chang Rok Moon, Seoul (KR)

(72) Inventors: Byung Jun Park, Gyeonggi-do (KR); Yong Woo Lee, Gyeonggi-do (KR); Chang Rok Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/837,356

(22) Filed: Mar. 15, 2013

(65) Prior Publication Data
US 2013/0203209 A1    Aug. 8, 2013

Related U.S. Application Data

(62) Division of application No. 12/705,678, filed on Feb. 15, 2010, now Pat. No. 8,426,938.

(30) Foreign Application Priority Data

Feb. 16, 2009   (KR) ........................ 10-2009-0012516
Feb. 27, 2009   (KR) ........................ 10-2009-0016948

(51) Int. Cl.
     *H01L 31/00*      (2006.01)
     *H01L 27/146*      (2006.01)

(52) U.S. Cl.
USPC ............ 257/459; 257/80; 257/291; 257/292; 257/294; 257/E31.001; 257/E31.097; 257/E31.113; 348/294; 438/48; 438/70; 438/73

(58) Field of Classification Search
USPC ............ 257/80, 291, 292, 294, 459, E31.001, 257/E31.097, E31.113; 348/294; 438/48, 438/70, 73

See application file for complete search history.

(56) References Cited

U.S. PATENT DOCUMENTS

| | | | |
|---|---|---|---|
| 7,847,299 B2 | 12/2010 | Noma | |
| 8,217,484 B2 | 7/2012 | Park | |
| 2006/0043438 A1* | 3/2006 | Holm et al. | 257/291 |
| 2006/0071342 A1 | 4/2006 | Umemoto et al. | |
| 2006/0076590 A1 | 4/2006 | Pain | |
| 2009/0085143 A1* | 4/2009 | Park | 257/459 |
| 2011/0261223 A1 | 10/2011 | Akiyama | |

FOREIGN PATENT DOCUMENTS

| | | |
|---|---|---|
| JP | 2005-020024 A | 1/2005 |
| JP | 2005-353955 A | 12/2005 |
| JP | 2006-128392 A | 5/2006 |
| KR | 10-0720469 A | 5/2007 |

* cited by examiner

*Primary Examiner* — Dao H Nguyen
(74) *Attorney, Agent, or Firm* — Harness, Dickey & Pierce, P.L.C.

(57) ABSTRACT

The image sensor includes a substrate, an insulating structure formed on a first surface of the substrate and including a first metal wiring layer exposed by a contact hole penetrating the substrate, a conductive spacer formed on sidewalls of the contact hole and electrically connected to the first metal wiring layer, and a pad formed on a second surface of the substrate and electrically connected to the first metal wiring layer.

10 Claims, 18 Drawing Sheets

IMAGE SENSOR AND METHOD OF FABRICATING THE SAME

CROSS REFERENCE TO RELATED APPLICATION

This application is a divisional application of U.S. application Ser. No. 12/705,678, filed on Feb. 15, 2010, now allowed, which claims priority under U.S.C. §119 to Korean Patent Application Nos. 10-2009-0012516 filed on Feb. 16, 2009, and 10-2009-0016948 filed on Feb. 27, 2009, in the Korean Intellectual Property Office (KIPO), the entire contents of each of which are incorporated herein by reference.

BACKGROUND

1. Field

Example embodiments of the inventive concepts relate to an image sensor and a method of fabricating the same, and more particularly, to an image sensor having improved reliability and productivity and a method of fabricating the image sensor.

2. Description of the Related Art

Image sensors are devices that convert an optical image into an electrical signal. With recent advancements in computer and communication industries, the demands for image sensors with enhanced performance are increasing in various fields such as digital cameras, camcorders, personal communication systems, game devices, security cameras, microcameras for medical use, and robots.

In an image sensor, light entering a lens, which is formed on a plurality of wiring layers, passes through the wiring layers to be incident upon a photoelectric conversion unit. In this structure, light is hindered by the layout of the wiring layers. Thus, the amount of light, which actually reaches the photoelectric conversion unit, is not large. That is, the wiring layers reduce an aperture ratio for the photoelectric conversion unit, thereby significantly reducing the amount of light incident upon the photoelectric conversion unit, which, in turn, reduces sensitivity.

SUMMARY

Example embodiments of the inventive concepts provide an image sensor having improved reliability and productivity. Example embodiments of the inventive concepts also provide a method of fabricating an image sensor having improved reliability and productivity.

However, example embodiments of the inventive concepts are not restricted to the one set forth herein. The above and other aspects of example embodiments of the inventive concepts will become more apparent to one of ordinary skill in the art to which the inventive concepts by referencing the detailed description of example embodiments of the inventive concepts given below.

According to example embodiments of the inventive concepts, an image sensor may include a substrate; an insulating structure formed on a first surface of the substrate and including a first metal wiring layer; a contact hole penetrating the substrate to expose the first metal wiring layer; a conductive spacer formed on sidewalls of the contact hole and electrically connected to the first metal wiring layer; and a pad formed on a second surface of the substrate and electrically connected to the first metal wiring layer.

According to example embodiments of the inventive concepts, an image sensor may include a semiconductor substrate including a pad region, an optical black (OB) region, and a sensing region; an insulating structure formed on a first surface of the substrate and including a first metal wiring layer exposed by a contact hole configured to penetrate the substrate; a conductive pattern including a pad formed on a second surface of the semiconductor substrate in the pad region and electrically connected to the first metal wiring layer, and a blocking film formed on the insulating structure in the OB region and at the same height as the pad to cover the OB region; and a first passivation film formed between the second surface of the semiconductor substrate and the conductive pattern.

According to example embodiments of the inventive concepts, a method of fabricating an image sensor. The method may include forming a plurality of photoelectric conversion units, separated from each other by a plurality of isolation regions, in a substrate, forming an insulating structure including sequentially stacking a plurality of metal wiring layers on the substrate, bonding a support substrate to a first surface of the substrate, etching a second surface of the substrate, partially exposing the plurality of metal wiring layers by forming a contact hole penetrating the substrate, forming a conductive spacer electrically connected to the exposed metal wiring layers, on sidewalls of the contact hole, and forming a pad, electrically connected to the exposed metal wiring layers, on the second surface of the substrate.

According to example embodiments of the inventive concepts, there is provided a method of fabricating an image sensor. The method may include providing a substrate including a pad region, an OB region, and a sensing region, forming an insulating structure including a metal wiring layer on a first surface of the substrate, forming a first passivation film on a second surface of the substrate, exposing a portion of the metal wiring layer in the pad region by forming a contact hole penetrating the first passivation film and the substrate, and forming a conductive pattern on the first passivation film including a pad electrically connected to the metal wiring layer by the contact hole, and a blocking film formed in the OB region at the same height as the pad to cover the OB region.

According to example embodiments of the inventive concepts, there is provided a method of fabricating an image sensor. The method may include providing a semiconductor substrate, bonding a support substrate to a first surface of the semiconductor substrate, etching a second surface of the semiconductor substrate, forming a first passivation film on the etched second surface of the semiconductor substrate, forming a conductive pattern including a pad for inputting or outputting external signals on the first passivation film, and performing a first annealing process to remove dangling bonds from the semiconductor substrate.

BRIEF DESCRIPTION OF THE DRAWINGS

The above and other aspects and features of example embodiments of the inventive concepts will become more apparent by describing in detail example embodiments thereof with reference to the attached drawings, in which.

DETAILED DESCRIPTION OF EXAMPLE EMBODIMENTS

Figure 1:
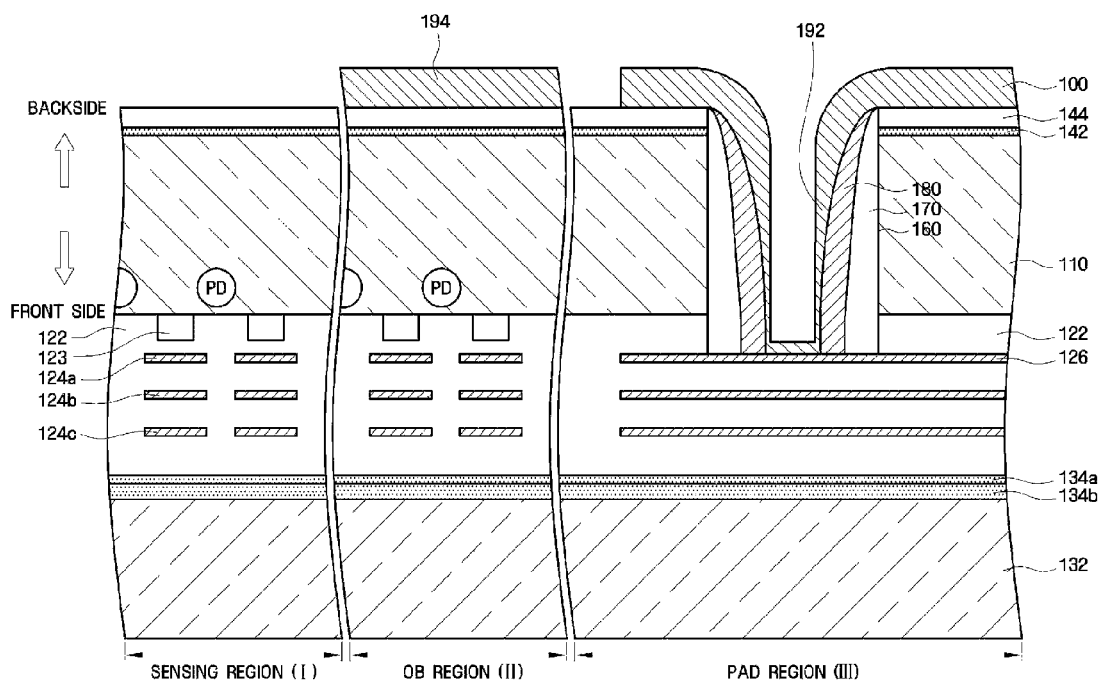
FIG. 1 is a cross-sectional view of an image sensor according to an example embodiment of the inventive concepts.

Advantages and features of the inventive concepts and methods of accomplishing the same may be understood more readily by reference to the following detailed description of example embodiments and the accompanying drawings. The inventive concepts may, however, be embodied in many different forms and should not be construed as being limited to the embodiments set forth herein. Rather, these embodiments are provided so that this disclosure will be thorough and complete and will fully convey the concept of the invention to those skilled in the art, and the inventive concepts will only be defined by the appended claims. In some embodiments, well-known processing processes, well-known structures and well-known technologies will not be specifically described in order to avoid ambiguous interpretation of the inventive concepts.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like reference numerals refer to like elements throughout the specification. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the inventive concepts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof. As used herein, the term "and/or" includes any and all combinations of one or more of the associated listed items. Like numbers refer to like elements throughout Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

Hereinafter, image sensors according to example embodiments of the inventive concepts will be described in detail with reference to the attached drawings. Image sensors according to example embodiments of the inventive concepts include charge coupled device (CCD) image sensors and complementary metal oxide semiconductor (CMOS) image sensors. CCD image sensors have less noise and better image quality than CMOS image sensors. However, since CCD image sensors require high voltages, their processing costs are higher. On the other hand, CMOS image sensors can be driven using a simple driving method and can be implemented using various scanning methods. In addition, because signal processing circuits can be integrated onto a single chip, smaller products can be manufactured. Also, since compatible CMOS processing technology is used, manufacturing costs can be reduced. Due to their low power consumption, CMOS image sensors can be applied in products with limited battery capacity. In this regard, CMOS image sensors will hereinafter be described as image sensors according to example embodiments of the inventive concepts. However, it should be understood that the technical spirit of the inventive concepts can also be applied to CCD image sensors.

FIG. 1 is a cross-sectional view of an image sensor according to an example embodiment of the inventive concepts. In FIG. 1, a sensing region I in which an active pixel sensor (APS) array is formed, an optical black (OB) region II, and a pad region III in which a pad 100 is formed are shown.

Referring to FIG. 1, the image sensor according to the example embodiment of the inventive concepts may include the sensing region I in which the APS array is formed, the OB region II, and the pad region III in which the pad 100 is formed. The OB region II blocks the inflow of light and thus provides a reference of a black signal to an active pixel region. While the OB region II has the same structure as the sensing region I, its function is to block the inflow of light.

Photoelectric conversion elements, e.g., photodiodes PDs, may be formed in a substrate 110 of the sensing region I and the OB region II, and a plurality of gates 123 may be disposed on the substrate 110. Each of the gates 123 may be a gate of a charge transmission element, a gate of a reset element, or a gate of a drive element. Various types of substrates may be used as the substrate 110. For example, the substrate 110 may be a P- or N-type bulk substrate, a substrate formed by growing a P- or N-type epitaxial layer on a P-type bulk substrate, or a substrate formed by growing a P- or N-type epitaxial layer on an N-type bulk substrate. In addition, the substrate 110 may not necessarily be a semiconductor substrate but may also be, e.g., an organic plastic substrate. The substrate 110 shown in FIG. 1 includes only an epitaxial layer that remains after the whole of a bulk substrate is removed in a grinding process which will be described later with reference to FIG. 5. However, the inventive concepts are not limited thereto. That is, when necessary, a portion of the bull substrate may not be removed.

An insulating structure is disposed on a front side of the substrate 110. The insulating structure includes an interlayer insulating film 122, a plurality of wiring layers 124a through 124c which are formed in the sensing region I and the OB region II and are sequentially stacked, and a first metal wiring layer 126 which is formed in the pad region III. The first metal wiring layer 126 may be at the same level as the wiring layer 124a which is the lowest of all the wiring layers 124a through 124c. When necessary, the first metal wiring layer 126 may be at the same level as the wiring layer 124b or 124c, which is the second or third lowest of the wiring layers 124a through 124c. The first metal wiring layer 126 and a wiring layer (the wiring layer 124a in FIG. 1), which is at the same level as the first metal wiring layer 126, may be made of the same material. Here, the level of each of the wiring layers 124a through 124c is measured based on the substrate 110.

A support substrate 132 is bonded and fixed onto the insulating structure (i.e., the interlayer insulating film 122, the wiring layers 124a through 124c, and the first metal wiring layer 126). The support substrate 132 is implemented to secure the strength of the substrate 110 which was made thin in the grinding process. The support substrate 132 may not necessarily be a semiconductor substrate but may also be any substrate made of a material that can maintain mechanical strength. For example, the support substrate 132 may be a glass substrate.

To bond the support substrate 132 to the insulating structure, adhesive films 134a and 134b may be interposed between the support substrate 132 and the insulating structure. When the support substrate 132 is a silicon substrate, the adhesive films 134a and 134b may be, e.g., silicon oxide films.

A reflection reducing film 142 may be disposed on a backside of the substrate 110. The material/thickness of the reflection reducing film 142 may vary according to a wavelength of light used in a photo process. The reflection reducing film 142 may be formed by stacking, e.g., a silicon oxide film having a thickness of approximately 50 to 200 Å and a silicon nitride film having a thickness of approximately 300 to 500 Å.

A buffer film 144 is disposed on the reflection reducing film 142. The buffer film 144 prevents or reduces damage to the substrate 110 during a patterning process performed to form the pad 100. The buffer film 144 may be a silicon oxide film having a thickness of approximately 3000 to 8000 Å.

The pad region III of the image sensor according to the current example embodiment of the inventive concepts includes the buffer film 144, the reflection reducing film 142, and a contact hole 160 which penetrates the substrate 110 to expose the first metal wiring layer 126.

An insulating spacer 170 and a conductive spacer 180 may be formed on sidewalls of the contact hole 160. The insulating spacer 170 may be formed on the sidewalls of the contact hole 160 and may become narrower toward an upper end of the contact hole 160. The insulating spacer 170 may be an oxide film such as a silicon oxide film.

The conductive spacer 180 is formed on the insulating spacer 170 and is electrically connected to the first metal wiring layer 126. The width of the conductive spacer 180 may be reduced toward the upper end of the contact hole 160. Alternatively, the width of the conductive spacer 180 may remain unchanged toward the upper end of the contact hole 160. That is, the conductive spacer 180 may be conformally formed inside the contact hole 160. The conductive spacer 180 may be made of a conductive material. For example, the conductive spacer 180 may include tungsten (W). Also, the conductive spacer 180 may include a barrier film made of Ti/TiN. The conductive spacer 180 may be, but is not limited to, a chemical vapor deposition (CVD) film.

In FIG. 1, the conductive spacer 180 is formed on the insulating spacer 170 to expose a bottom surface of the contact hole 160. However, the inventive concepts is not limited thereto, and the conductive spacer 180 may also extend to the bottom surface of the contact hole 160. That is, portions of the conductive spacer 180 formed on both sidewalls of the contact hole 160 may be connected to each other on the bottom surface of the contact hole 160.

In the image sensor according to the current example embodiment of the inventive concepts, the conductive spacer 180 may be conformally formed inside the contact hole 160 or may become narrower toward the upper end of the contact hole 160. Since the conductive spacer 180 can be more conformally formed inside the narrow contact hole 160, the first metal wiring layer 126 can be electrically connected to a contact 192, which is to be formed on the first metal wiring layer 126, in a more stable manner.

The pad 100 is formed in the pad region III and is electrically connected to the conductive spacer 180 inside the contact hole 160. Since the pad 100 is electrically connected to the conductive spacer 180 by the contact 192, the pad 100 can be electrically connected to the first metal wiring layer 126. Alternatively, as shown in FIG. 1, the first metal wiring layer 126 and the contact 192 may directly contact each other on the bottom surface of the contact hole 160. That is, in the image sensor according to the current example embodiment of the inventive concepts, the pad 100 can be electrically connected to the first metal wiring layer 126 by contacting not only the first metal wiring layer 126 but also the conductive spacer 180. Therefore, the first metal wiring layer 126 and the pad 100 can be electrically connected to each other in a more stable manner.

A blocking film 194 may be formed in the OB region II. The blocking film 194 covers the entire top surface of the OB region II, thereby blocking the inflow of light into the OB region II. The blocking film 194 and a conductive film for forming the pad 100 may be formed by the same process and/or may be made of the same material. However, the inventive concepts are not limited thereto.

The pad 100 and the blocking film 194 may be conductive materials and may include, e.g., aluminum. In addition, the pad 100 and the blocking film 194 may include a barrier film, such as Ti/TiN, and/or a capping film such as Ti/TiN. Specifically, Ti/TiN, Al, and Ti/TiN may be sequentially stacked to form the pad 100 and the blocking film 194.

Figure 2:
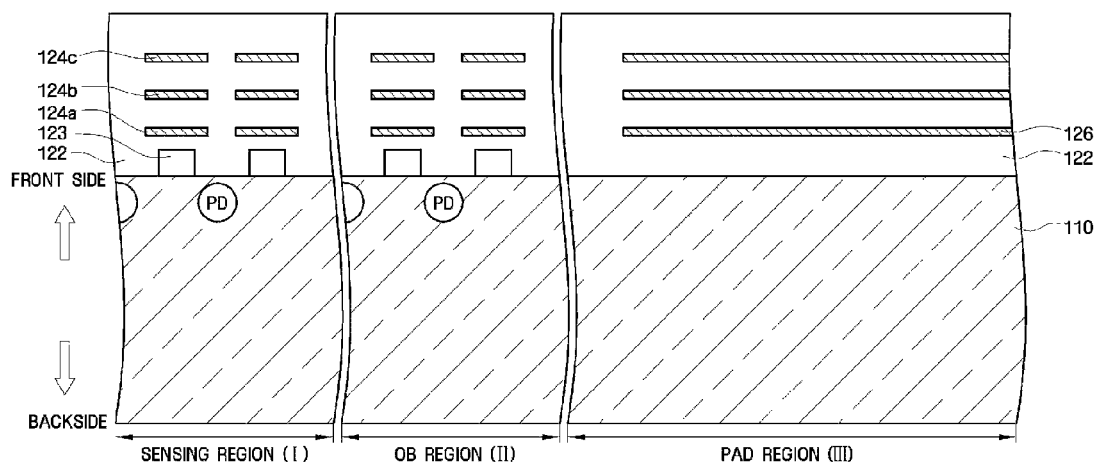
FIGS. 2 through 10 are cross-sectional views for explaining a method of fabricating the image sensor of FIG. 1.

Hereinafter, a method of fabricating the image sensor of FIG. 1 will be described with reference to FIGS. 1 through 10. FIGS. 2 through 10 are cross-sectional views for explaining a method of fabricating the image sensor of FIG. 1. Referring to FIG. 2, isolation regions (not shown), such as shallow trench isolation (STI) regions or deep trench isolation (DTI) regions, are formed in the substrate 110 to define the sensing region I, the OB region II, and the pad region III.

Next, a plurality of pixels are formed in the sensing region I and the OB region II. Specifically, photoelectric conversion elements, e.g., photodiodes PDs, are formed in the sensing region I and the OB region II, and the gates 123 are formed. Each of the gates 123 may be a gate of a charge transmission element, a gate of a reset element, or a gate of a drive element.

Next, the insulating structure is formed on the front side of the substrate 110. Specifically, the insulating structure includes the interlayer insulating film 122, the wiring layers 124a through 124c which are formed in the sensing region I and the OB region II and are sequentially stacked, and the first metal wiring layer 126 which is formed in the pad region III. The first metal wiring layer 126 may be at the same level as the wiring layer 124a which is the lowest of all the wiring layers 124a through 124c.

Figure 3:
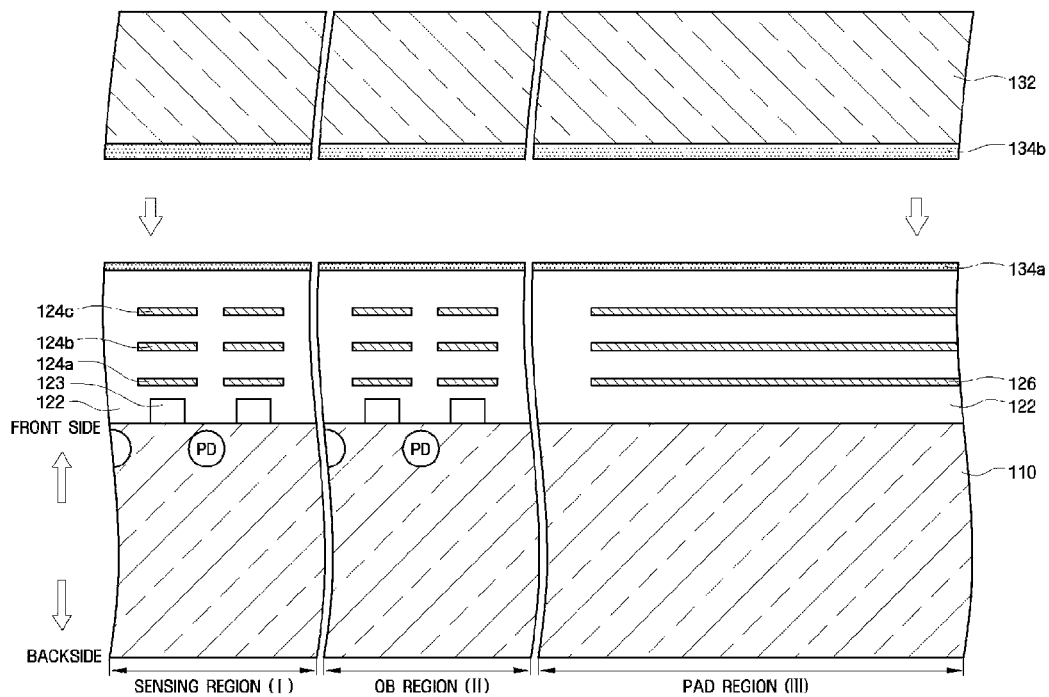

Referring to FIG. 3, the support substrate 132 is bonded onto the insulating structure.

Figure 4:
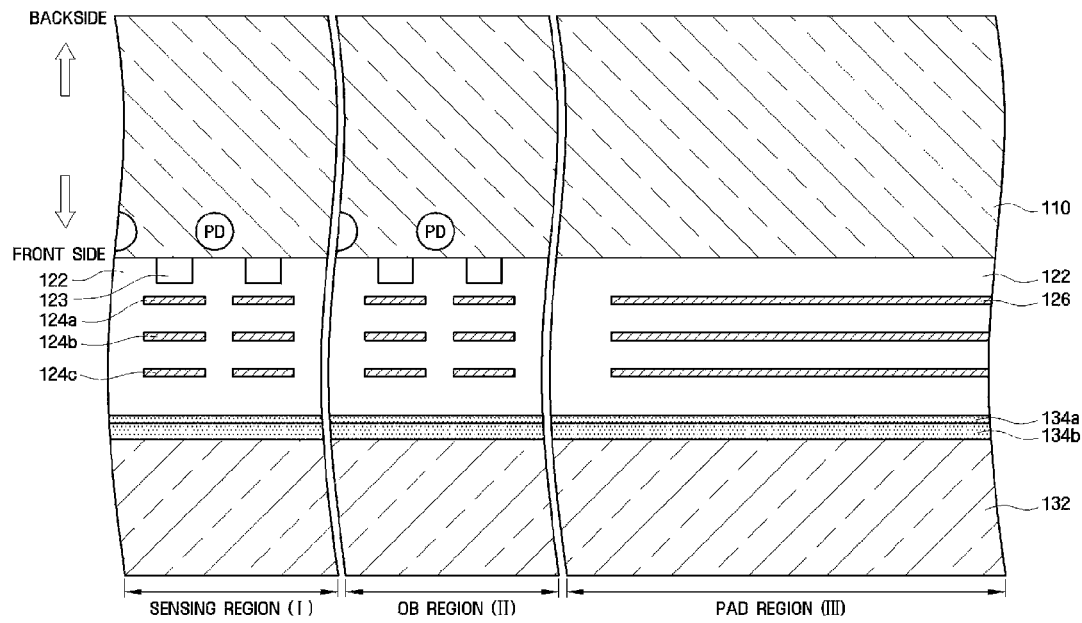

Specifically, the first adhesive film 134a is formed on the insulating structure and then planarized. In addition, the second adhesive film 134b is formed on the support substrate 132. Then, the support substrate 132 is bonded to the substrate 110 such that the adhesive films 134a and 134b face each other. Referring to FIG. 4, the substrate 110 is turned over.

Figure 5:
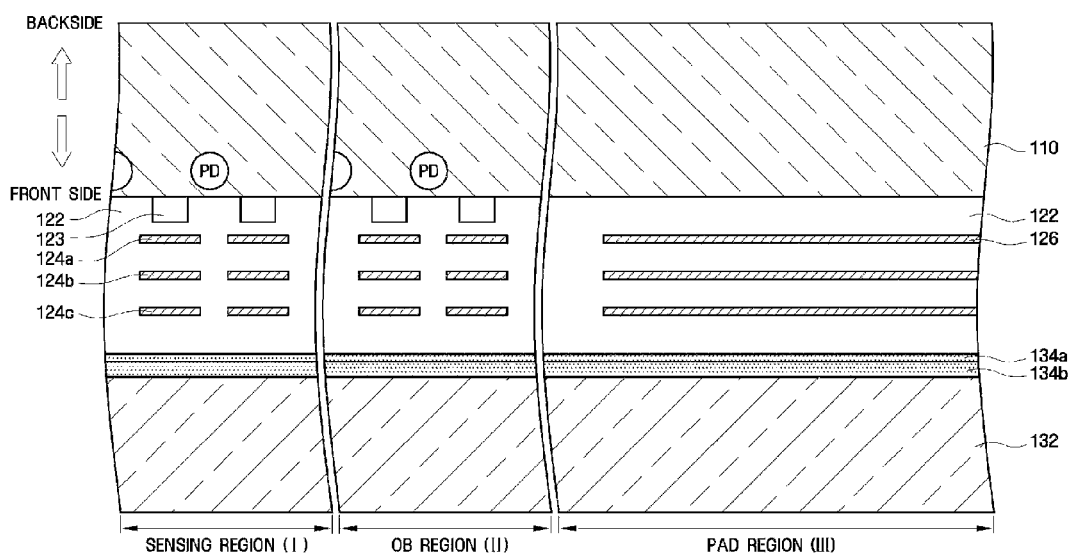

Referring to FIG. 5, the backside of the substrate 110 is grinded. Specifically, the backside of the substrate 110 is ground by chemical mechanical polishing (CMP), back grinding (BGR), reactive ion etching, or a combination of the same. The thickness of the substrate 110, which remains after the grinding process, may be, but is not limited to, about 3 to 5 μm.

Figure 6:
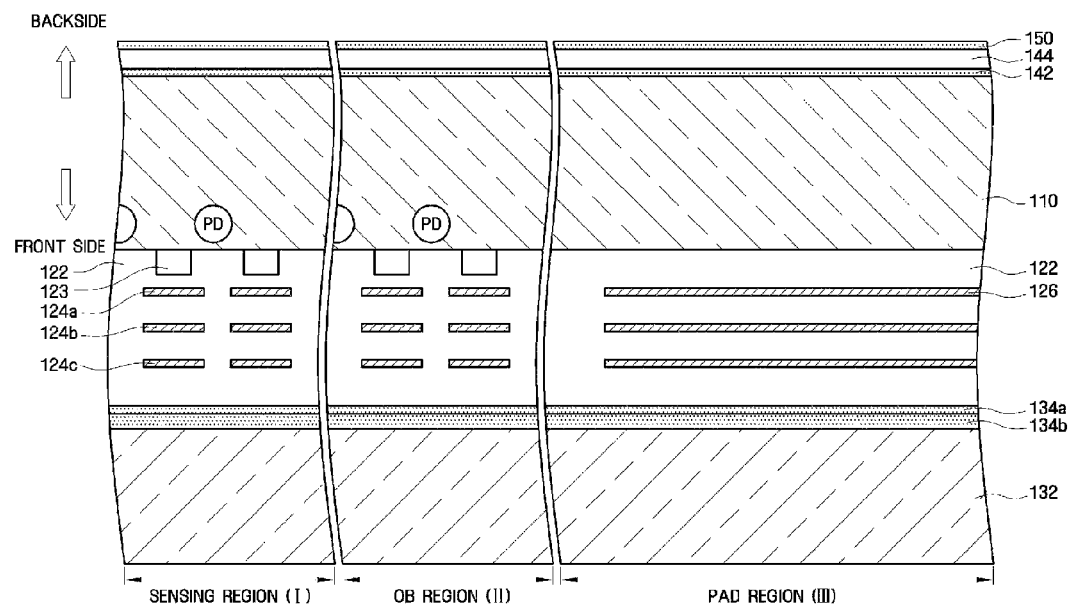

Referring to FIG. 6, the reflection reducing film 142 is formed on the backside of the substrate 110. For example, a silicon oxide film having a thickness of about 50 to 200 Å and a silicon nitride film having a thickness of about 300 to 500 Å may be stacked using a CVD method, thereby forming the reflection reducing film 142.

Next, the buffer film 144 is formed on the reflection reducing film 142. For example, a silicon oxide film having a thickness of about 3000 to 8000 Å may be stacked using the CVD method, thereby forming the buffer film 144. Then, a hard mask film 150 is formed on the buffer film 144. The hard mask film 150 may be e.g., a silicon nitride film, a silicon oxide film, or a combination of the same.

Figure 7:
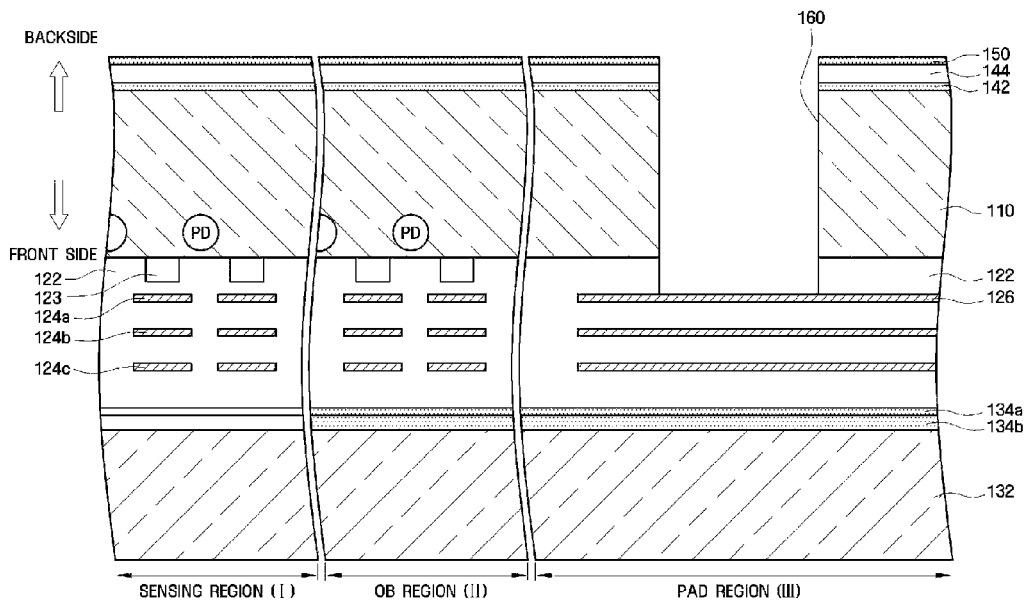

Referring to FIG. 7, the contact hole 160 is formed in the pad region III. Specifically, a photoresist pattern (not shown) is formed on the hard mask film 150, and the hard mask film 150 is patterned using the photoresist pattern. Then, the photoresist pattern is removed, and the contact hole 160, which penetrates the buffer film 144, the reflection reducing film 142, and the substrate 110 and exposes the first metal wiring layer 126, is formed using the patterned hard mask film 150. The contact hole 160 may be formed by, e.g., anisotropic etching.

Figure 8:
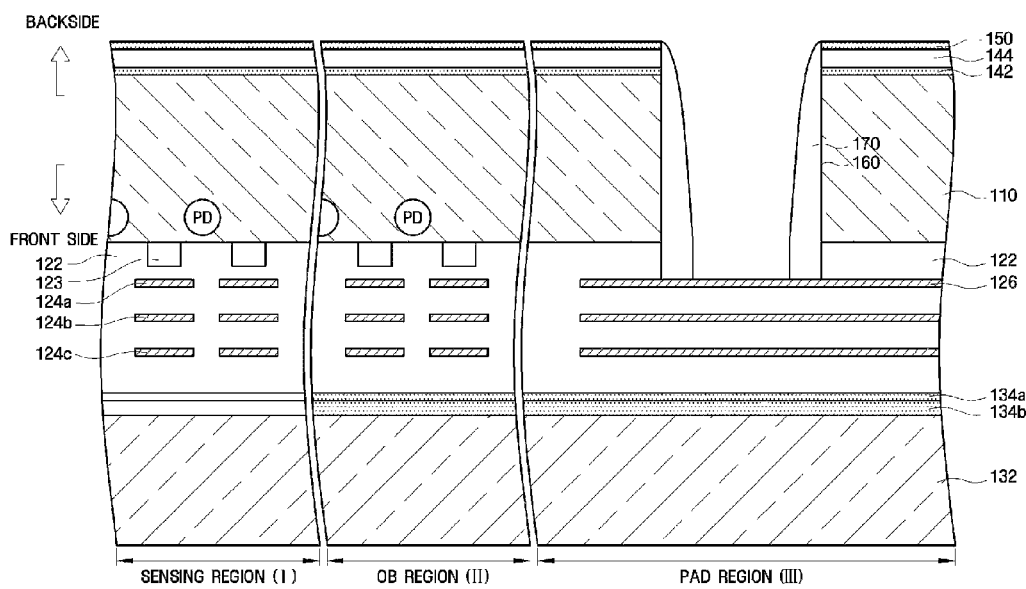

Referring to FIG. 8, after the hard mask film 150 is removed, an insulating material is deposited within the contact hole 160 and then partially etched to form the insulating spacer 170. For example, an insulating material may be deposited within the contact hole 160 by CVD. Then, the insulating material may be etched back to expose the first metal wiring layer 126, thereby forming the insulating spacer 170.

Figure 9:
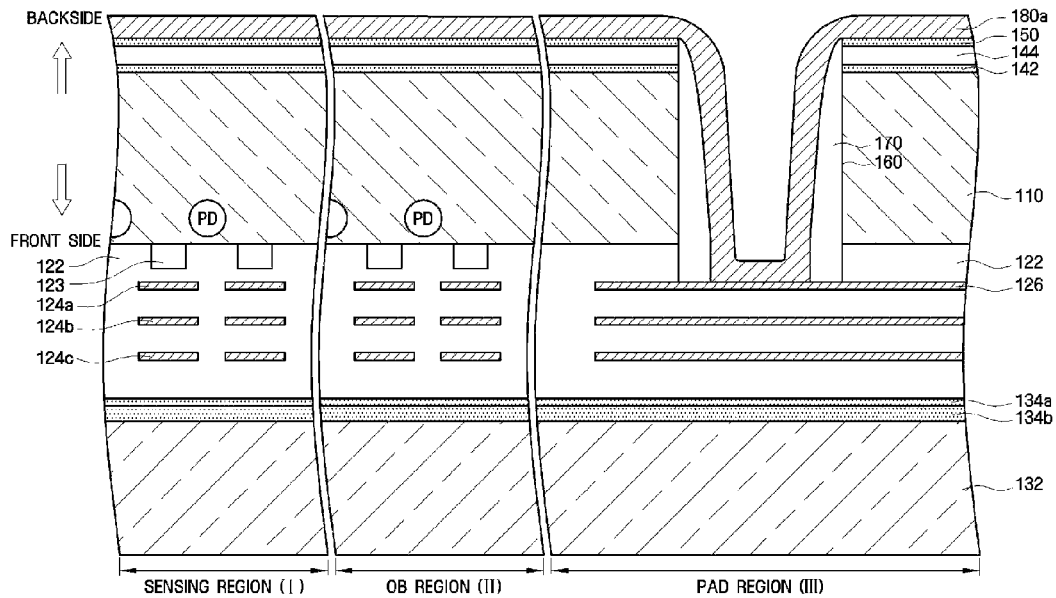

Referring to FIG. 9, a conductive layer 180a is formed on the substrate 110 having the insulating spacer 170. The conductive layer 180a may be conformally formed inside the contact hole 160. The conductive layer 180a may be formed using the CVD method. However, the inventive concepts are not limited to the CVD method. That is, any deposition method by which a material can be deposited conformally can be used to form the conductive layer 180a, and the CVD method is one of such deposition methods. The conductive layer 180a may include tungsten (W). Also, the conductive layer 180a may include a barrier film made of Ti/TiN. That is, the conductive layer 180a may be formed by sequentially depositing Ti/TiN and W.

Figure 10:
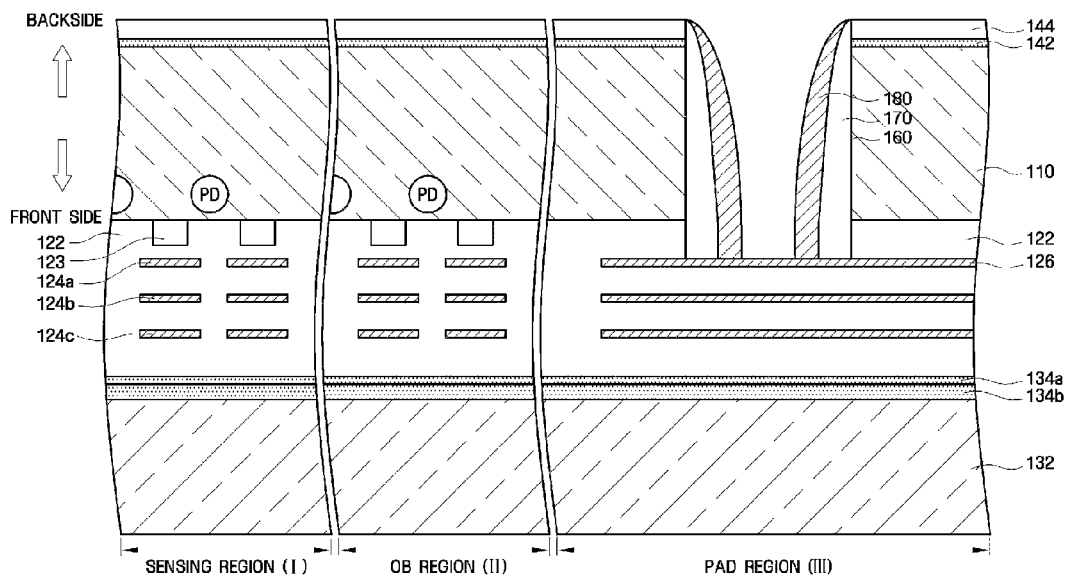

Referring to FIG. 10, a portion of the conductive layer 180a (see FIG. 9) may be etched to form the conductive spacer 180 on the sidewalls of the contact hole 160. Here, a portion of the conductive layer 180a may be etched by an etch-back process. That is, the entire surface of the substrate 110 may be etched back such that the conductive layer 180a remains only on the sidewalls of the contact hole 160, thereby forming the conductive spacer 180. Alternatively, a portion of the conductive layer 180a may be etched by a CMP process. That is, the CMP process may be performed on the entire surface of the substrate 110 such that the conductive layer 180a above the buffer film 144 is all etched and only the conductive layer 180a within the contact hole 160 remains, thereby forming the conductive spacer 180. In this case, lower portions of the conductive spacer 180 may be connected to each other.

Alternatively, a portion of the conductive layer 180a may be etched by both an etch-back process and a CMP process. In this case, the CMP process may be performed before or after the etch-back process. A process that can be performed to etch a portion of the conductive layer 180a is not limited to the above processes. That is, it is obvious to those of ordinary skill in that art that any process can be used to etch a portion of the conductive layer 180a as long as the conductive spacer 180 can be formed only inside the contact hole 160.

The conductive spacer 180 is formed on the insulating spacer 170 and thus electrically connected to the first metal wiring layer 126. The width of the conductive spacer 180 may be reduced toward the upper end of the contact hole 160. Alternatively, the width of the conductive spacer 180 may remain unchanged toward the upper end of the contact hole 160. That is, the conductive spacer 180 may be conformally formed inside the contact hole 160. The conductive spacer 180 may be formed on the insulating spacer 170 to expose the bottom surface of the contact hole 160. However, the inventive concepts are not limited thereto, and the conductive spacer 180 may also extend to the bottom surface of the contact hole 160. That is, portions of the conductive spacer 180 formed on both sidewalls of the contact hole 160 may be connected to each other on the bottom surface of the contact hole 160.

Referring back to FIG. 1, the contact 192 and the pad 100 are formed in the pad region III and are electrically connected to the conductive spacer 180 inside the contact hole 160. In addition, the blocking film 194, which blocks light, is formed in the OB region II.

Specifically, a conductive material (not shown) is conformally formed along the buffer film 144 and the conductive spacer 180. Accordingly, the contact 192, the pad 100, and the blocking film 194 are formed simultaneously. In the current example embodiment of the inventive concepts, the contact 192 and the pad 100 are formed simultaneously. However, the inventive concepts are not limited thereto. When necessary, the contact 192, which is electrically connected to the first metal wiring layer 126 or the conductive spacer 180, may be formed by a separate process. Then, the pad 100, which is electrically connected to the contact 192, may be formed.

Figure 11:
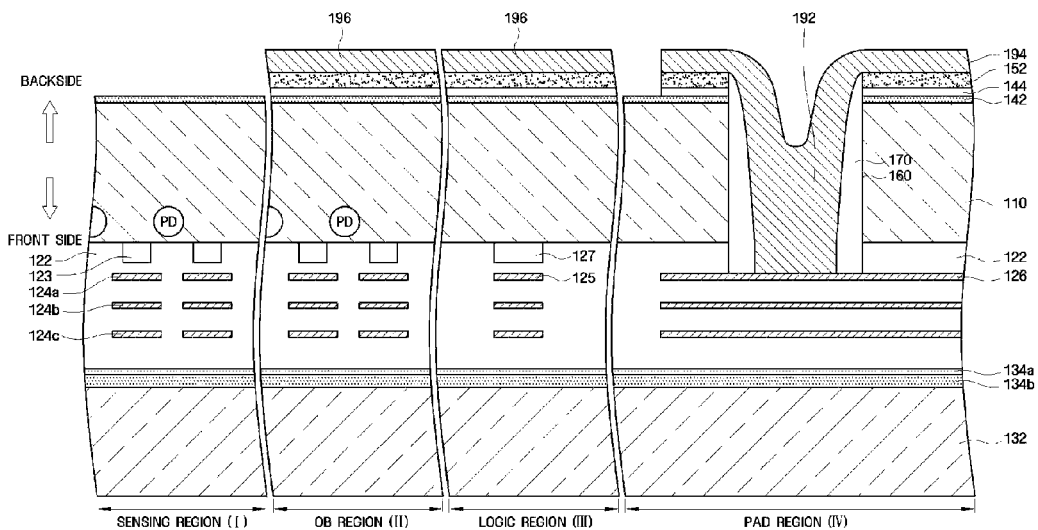
FIG. 11 is a cross-sectional view of an image sensor according to another example embodiment of the inventive concepts.

FIG. 11 is a cross-sectional view of an image sensor according to another example embodiment of the inventive concepts. In FIG. 11, a sensing region I in which an APS array is formed, an OB region II, a logic region III in which a peripheral circuit is formed, and a pad region IV in which a pad 194 is formed are shown.

Referring to FIG. 11, the image sensor according to the current example embodiment of the inventive concepts includes the sensing region I in which the APS array is formed, the OB region II, the logic region III in which the peripheral circuit is formed, and the pad region IV in which the pad 194 is formed. The OB region II blocks the inflow of light and thus provides a reference of a black signal to an active pixel region. While the OB region II has the same structure as the sensing region I, its function is to block the inflow of light. Accordingly, dark current of active pixels in the sensing region I are corrected based on dark current of the OB region II. The logic region III includes a core region and a peripheral region in which the peripheral circuit is formed and blocks the inflow of light.

Photoelectric conversion elements, e.g., photodiodes PDs, may be formed in a substrate 110 of the sensing region I and the OB region II, and a plurality of gates 123 may be disposed on the substrate 110. Each of the gates 123 may be a gate of a charge transmission element, a gate of a reset element, or a gate of a drive element. Various types of substrates may be used as the substrate 110. For example, the substrate 110 may be a P- or N-type bulk substrate, a substrate formed by growing a P- or N-type epitaxial layer on a P-type bulk substrate, or a substrate formed by growing a P- or N-type epitaxial layer on an N-type bulk substrate. In addition, the substrate 110 may not necessarily be a semiconductor substrate but may also be, e.g., an organic plastic substrate. The substrate 110 shown in FIG. 11 includes only an epitaxial layer that remains after the whole of a bulk substrate is removed in a grinding process which will be described later with reference to FIG. 15. However, the inventive concepts are not limited thereto. That is, when necessary, a portion of the bulk substrate may not be removed.

In the logic region III, an integrated circuit, which includes one or more gates 127 for operation of elements and transmission/reception of signals, may be formed. An insulating structure is disposed on a front side of the substrate 110. The insulating structure includes an interlayer insulating film 122, a plurality of wiring layers 124a through 124c which are formed in the sensing region I and the OB region II and are sequentially stacked, a wiring layer 125 which is formed in the logic region III, and a first metal wiring layer 126 which is formed in the pad region IV. The first metal wiring layer 126 may be at the same level as the wiring layer 124a which is the lowest of all the wiring layers 124a through 124c. When necessary, the first metal wiring layer 126 may be at the same level as the wiring layer 124b or 124c which is the second or third lowest of the wiring layers 124a through 124c. The first metal wiring layer 126 and a wiring layer (the wiring layer 124a in FIG. 11), which is at the same level as the first metal wiring layer 126, may be made of the same material. Here, the level of each of the wiring layers 124a through 124c is measured based on the substrate 110.

A support substrate 132 is bonded and fixed onto the insulating structure (i.e., the interlayer insulating film 122, the wiring layers 124a through 124c, the wiring layer 125, and the first metal wiring layer 126). The support substrate 132 is implemented to secure the strength of the substrate 110 which was made thin in the grinding process. The support substrate 132 may not necessarily be a semiconductor substrate but may also be any substrate made of a material that can maintain mechanical strength. For example, the support substrate 132 may be a glass substrate.

To bond the support substrate 132 to the insulating structure, first and second adhesive films 134a and 134b may be interposed between the support substrate 132 and the insulating structure. When the support substrate 132 is a silicon substrate, the adhesive films 134a and 134b may be, e.g., silicon oxide films. A reflection reducing film 142 may be disposed on a backside of the substrate 110. The material/thickness of the reflection reducing film 142 may vary according to a wavelength of light used in a photo process. The reflection reducing film 142 may be formed by stacking, e.g., a silicon oxide film having a thickness of about 50 to 200 Å and a silicon nitride film having a thickness of about 300 to 500 Å.

A buffer film 144 is disposed on the reflection reducing film 142. The buffer film 144 may be a silicon oxide film having a thickness of about 100 to 5000 Å. The buffer film 144 is designed to prevent or reduce damage to the substrate 110 during a patterning process for forming a conductive pattern which includes a contact 192, the pad 194, and a blocking film 196. Therefore, the buffer film 144 may be formed to a thickness sufficient to prevent or reduce damage to the substrate 110, for example, formed to a thickness of about 3,000 to 8,000 Å. In the image sensor according to the current example embodiment of the inventive concepts, a first passivation film 152 made of SiN is formed on the buffer film 144. Thus, the buffer film 144 does not need to be formed excessively thick. Since the thickness of the buffer film 144 included in the image sensor according to the current example embodiment of the inventive concepts is reduced, the step height between the sensing region I in which the buffer film 144 is not formed and the other regions in which the buffer film 144 is formed can be reduced. Consequently, uniformity of the entire surface of the substrate 110 can be enhanced, thereby making it possible to fabricate a more stable image element.

The first passivation film 152 is disposed on the buffer film 144. The first passivation film 152 may be a nitride film, that is, may be made of SiN. The first passivation film 152 may be formed to a thickness of about 1000 to 5000 Å. The first passivation film 152 protects the substrate 110 in a patterning process for forming the conductive pattern which includes the contact 192, the pad 194, and the blocking film 196. In addition, the first passivation film 152 may function as a passivation film in an annealing process that is performed to remove dangling bonds after the conductive pattern is formed. Since the first passivation film 152 is formed adjacent to the substrate 110, dangling bonds can be removed more efficiently.

Generally, a passivation film is formed on a conductive pattern. Thus, the passivation film is separated from a substrate by a large distance, and the conductive pattern is disposed between the passivation film and the substrate. Accordingly, efficiently performing a passivation process may be difficult when an annealing process is performed to remove dangling bonds of the substrate. In the image sensor according to the current example embodiment of the inventive concepts, however, the first passivation film 152 is formed under the pad 194 and the blocking film 196. That is, the first passivation film 152 is formed closer to the substrate 110. Accordingly, dangling bonds can be removed more efficiently in the annealing process.

In an image sensor, dark current of a line of active pixels in a sensing region is corrected based on dark current of an OB region II. Here, if the OB region has a large dark current and if there is a large difference in dark current between lines of active pixels, each line of active pixels in the sensing region I may have different characteristics, and this difference in characteristics between the lines of active pixels may cause signal defects and increase noise. However, in the image sensor according to the current example embodiment of the inventive concepts, since dangling bonds can be effectively removed, dark current of the OB region II is reduced, which, in turn, enhances the reliability of the image sensor.

The pad region IV includes a contact hole 160 which penetrates the first passivation film 152, the buffer film 144, the reflection reducing film 142, and the substrate 110 to expose the first metal wiring layer 126. An insulating spacer 170 is formed on sidewalls of the contact hole 160. The insulating spacer 170 may be formed on the sidewalls of the contact hole 160 and may become narrower toward an upper end of the contact hole 160. The insulating spacer 170 may be an oxide film such as a silicon oxide film.

The conductive pattern, which includes the pad 194 and the blocking film 196, is formed on the first passivation film 152. The pad 194 is formed in the pad region IV. The pad 194 is connected to the contact 192, which fills the contact hole 160 in the backside of the substrate 110, and thus electrically connected to the first metal wiring layer 126. The insulating spacer 170 insulates the contact 192 from the substrate 110. The blocking film 196 is formed in the logic region III and the OB region II at the same height as the pad 194 to cover the logic region III and the OB region II. In so doing, the blocking film 196 blocks light from entering the insulating structure (i.e., the interlayer insulating film 122, the wiring layers 124a through 124c, the wiring layer 125, and the first metal wiring layer 126).

The conductive pattern, which includes the contact 192, the pad 194, and the blocking film 196, may include aluminum. In addition, the pad 194 and the blocking film 196 may include a barrier film, such as Ti/TiN, and/or a capping film such as Ti/TiN. Specifically, Ti/TiN, Al, and Ti/TiN may be sequentially stacked to form the conductive pattern.

Figure 12:
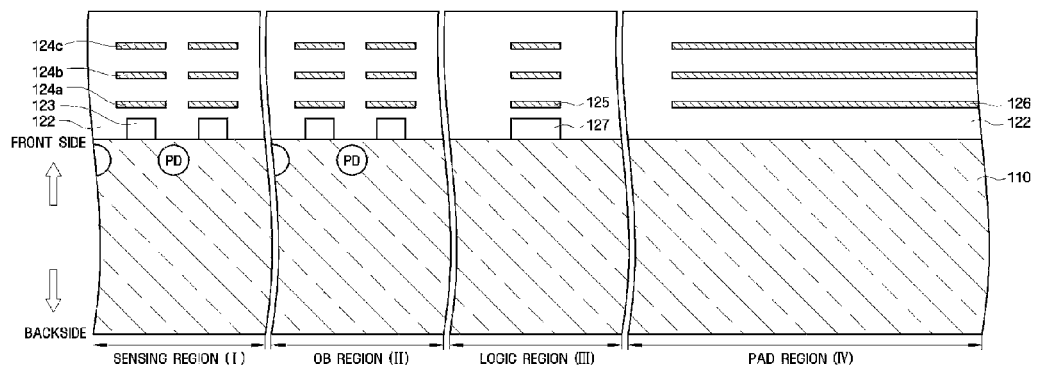
FIGS. 12 through 22 are cross-sectional views for explaining a method of fabricating the image sensor of FIG. 11.

Hereinafter, a method of fabricating the image sensor of FIG. 11 will be described with reference to FIGS. 12 through 22. FIGS. 12 through 22 are cross-sectional views for explaining a method of fabricating the image sensor of FIG. 11. Referring to FIG. 12, isolation regions (not shown), such as STI regions or DTI regions, are formed in the substrate 110 to define the sensing region I, the OB region II, the logic region III, and the pad region IV.

Next, a plurality of pixels are formed in the sensing region I and the OB region II. Specifically, photoelectric conversion elements, such as photodiodes PDs, are formed in the sensing region I and the OB region II, and the gates 123 are formed. Each of the gates 123 may be a gate of a charge transmission element, a gate of a reset element, or a gate of a drive element. In the logic region III, an integrated circuit, which includes one or more gates 127 for operation of elements and transmission/reception of signals, may be formed Next, the insulating structure is formed on the front side of the substrate 110. Specifically, the insulating structure includes the interlayer insulating film 122, the wiring layers 124a through 124c which are formed in the sensing region I and the OB region II and are sequentially stacked, the wiring layer 125 which is formed in the logic region III, and the first metal wiring layer 126 which is formed in the pad region IV. The first metal wiring layer 126 may be at the same level as the wiring layer 124a which is the lowest of all the wiring layers 124a through 124c.

Figure 13:
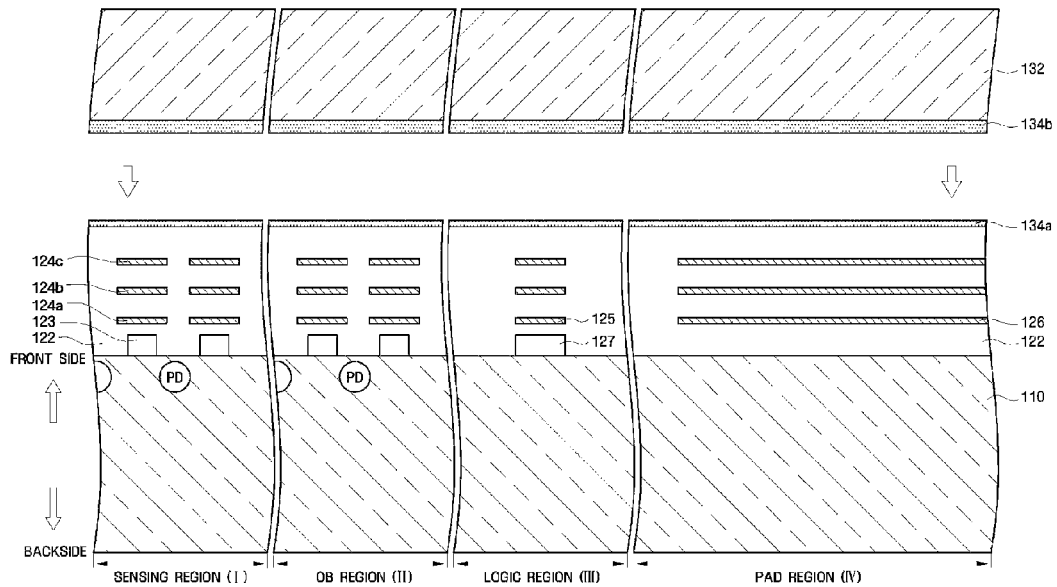

Referring to FIG. 13, the support substrate 132 is bonded onto the insulating structure. Specifically, the first adhesive film 134a is formed on the insulating structure and then planarized. In addition, the second adhesive film 134b is formed on the support substrate 132. Then, the support substrate 132 is bonded to the substrate 110 such that the first and second adhesive films 134a and 134b face each other.

Figure 14:
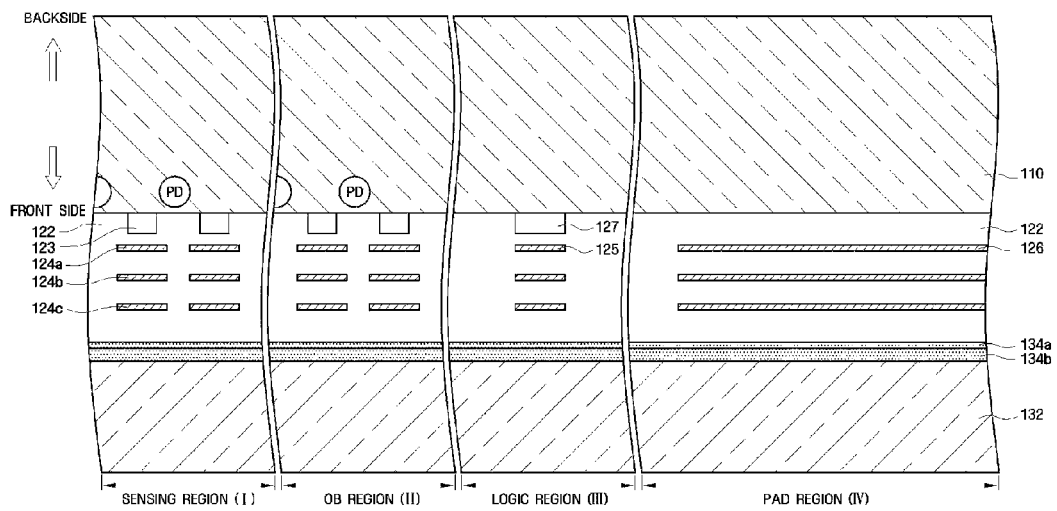
Figure 15:
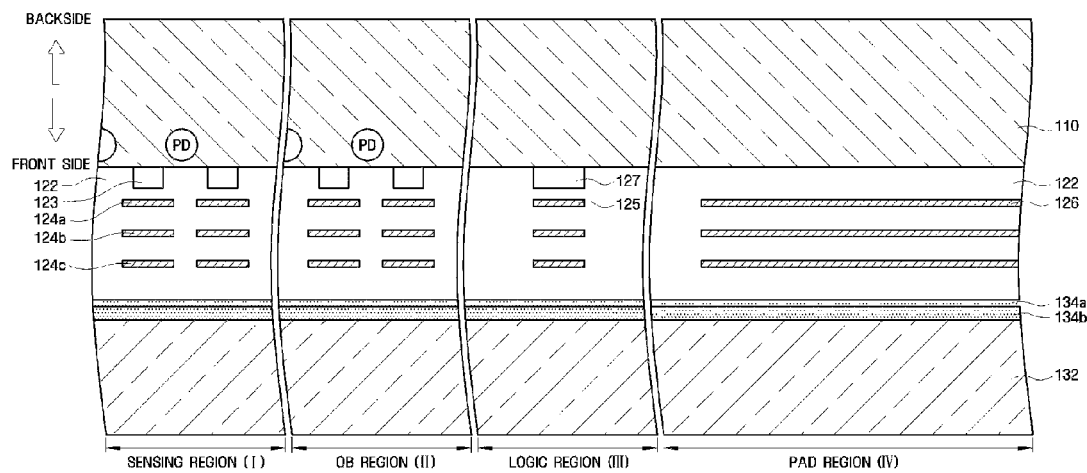

Referring to FIG. 14, the substrate 110 is turned over. Referring to FIG. 15, the backside of the substrate 110 is grinded. Specifically, the backside of the substrate 110 is ground by CMP (Chemical Mechanical Polishing), BGR (Back Grinding), reactive ion etching, or a combination of the same. The thickness of the substrate 110, which remains after the grinding process, may be, but is not limited to, about 3 to 5 μm.

Figure 16:
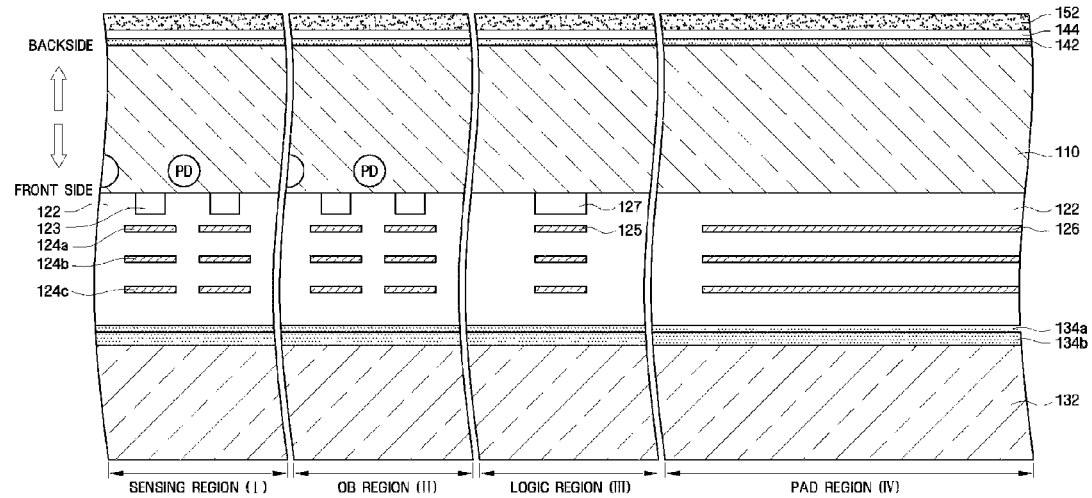

Referring to FIG. 16, the reflection reducing film 142 is formed on the backside of the substrate 110. For example, a silicon oxide film having a thickness of about 50 to 200 Å and a silicon nitride film having a thickness of about 300 to 500 Å may be stacked using the CVD method, thereby forming the reflection reducing film 142.

The buffer film 144 as an interlayer insulating film of the backside of the substrate is formed on the reflection reducing film 142. For example, a silicon oxide film having a thickness of about 100 to 5000 Å may be stacked using the CVD method, thereby forming the buffer film 144. The first passivation film 152 is formed on the buffer film 144. For example, a silicon nitride film (e.g., SiN) having a thickness of about 1,000 to 5,000 Å may be deposited using a plasma-enhanced chemical vapor deposition (PECVD) method, thereby forming the first passivation film 152.

Figure 17:
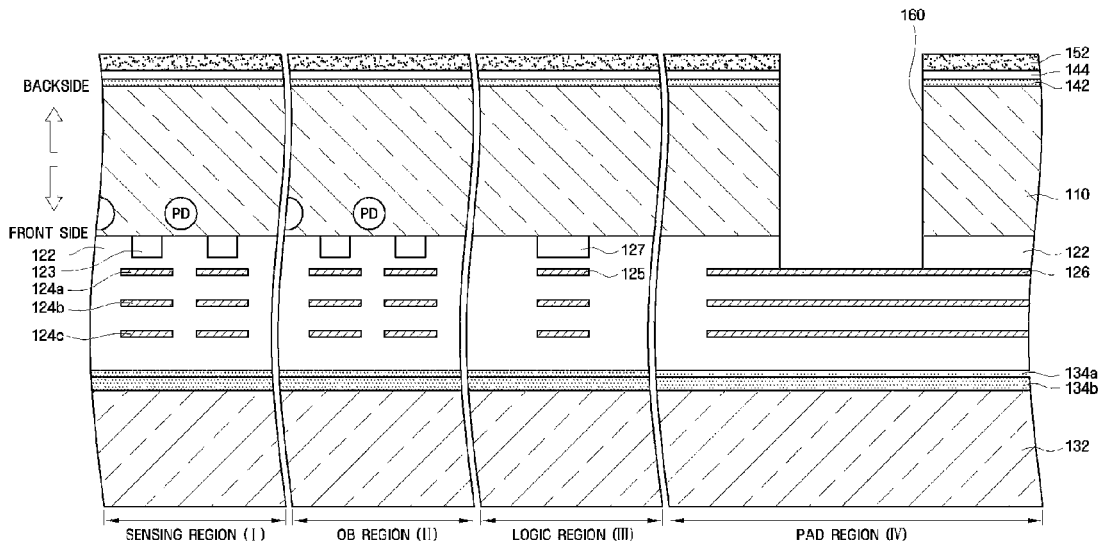

Referring to FIG. 17, the contact hole 160 is formed in the pad region IV. Specifically, a photoresist pattern (not shown) is formed on the first passivation film 152 by a photolithography process. Then, the contact hole 160, which penetrates the first passivation film 152, the buffer film 144, the reflection reducing film 142, and the substrate 110 and exposes the first metal wiring layer 126, is formed using the photoresist pattern as an etch mask. The contact hole 160 may be formed by anisotropic etching.

Figure 18:
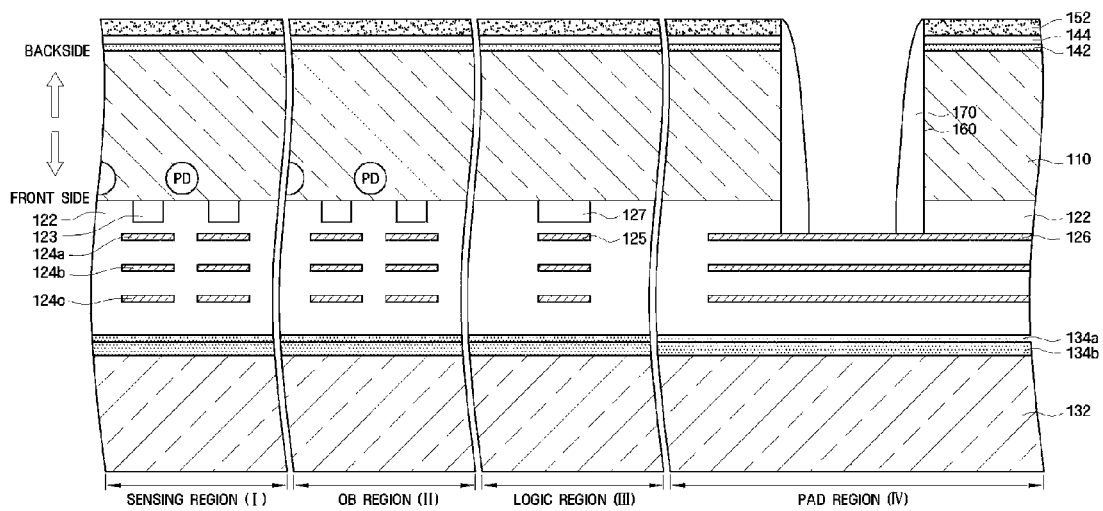

Referring to FIG. 18, an insulating material is deposited within the contact hole 160 and then partially etched to form the insulating spacer 170. For example, an insulating material may be deposited within the contact hole 160 by CVD. Then, the insulating material may be etched back to expose the first metal wiring layer 126, thereby forming the insulating spacer 170.

Figure 19:
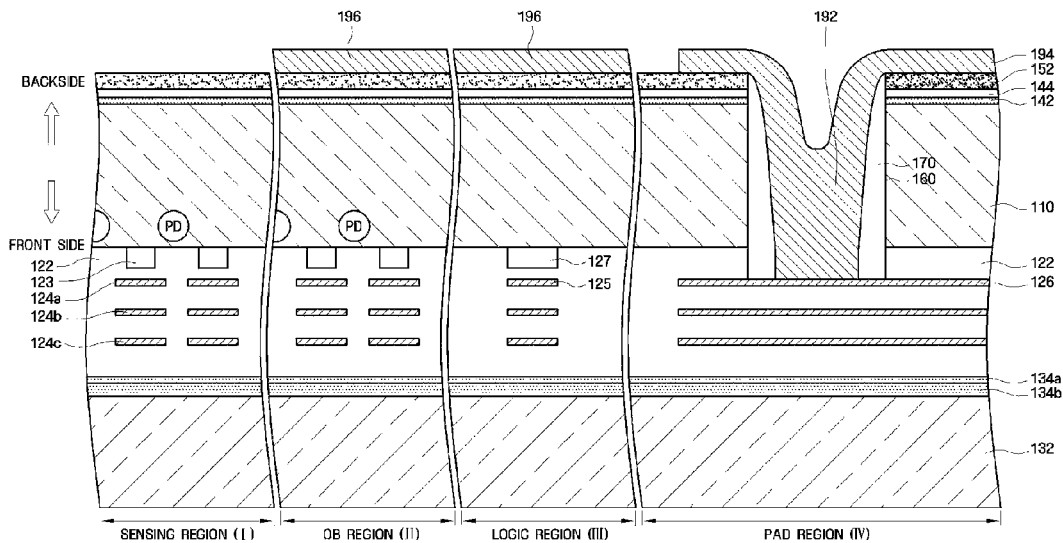

Referring to FIG. 19, the conductive pattern, which includes the contact 192, the pad 194 and the blocking film 196, is formed. Specifically, the contact 192, which fills the contact hole 160, and the pad 194 which extends from the contact 192 onto the first passivation film 152, are formed in the pad region IV, and the blocking film 196, which blocks light, is formed in the OB region II and the logic region III.

More specifically, a conductive material (not shown) is conformally formed along the first passivation film 152 and the insulating spacer 170 and then patterned. Accordingly, the contact 192, the pad 194, and the blocking film 196 are formed simultaneously. In the current example embodiment of the inventive concepts, the contact 192 and the pad 194 are formed simultaneously. However, the inventive concepts are not limited thereto. When necessary, the contact 192, which is electrically connected to the first metal wiring layer 126, may be formed by a separate process. Then, the pad 194, which is electrically connected to the contact 192, may be formed. In the current example embodiment of the inventive concepts, the conductive spacer 180 shown in FIG. 1 is omitted. Thus, the conductive material can be easily formed in the contact hole 160.

Figure 20:
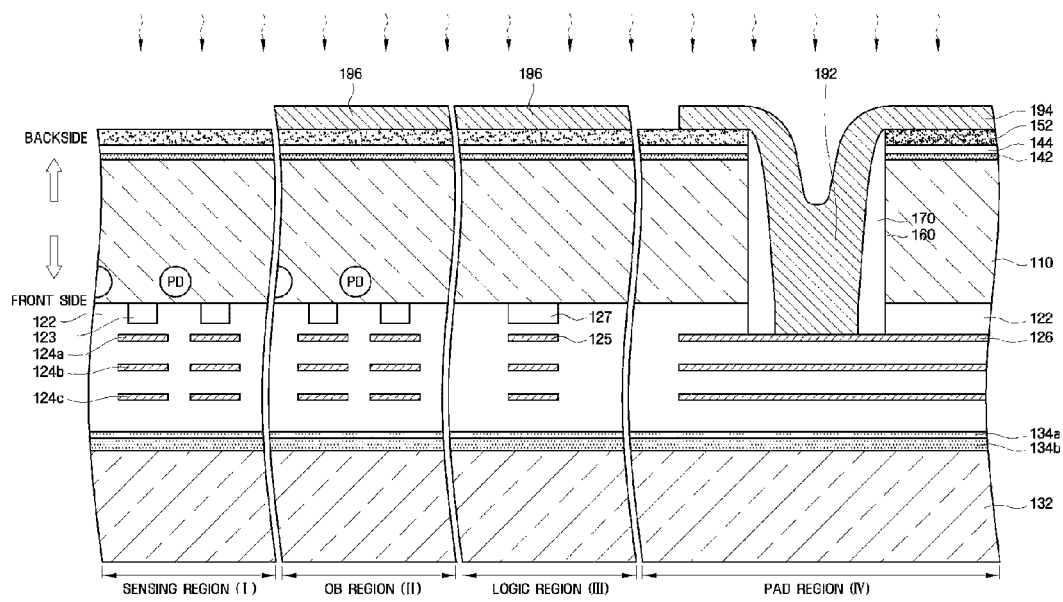

Referring to FIG. 20, a first annealing process is performed. The first annealing process may be performed for passivation. In the first annealing process, dangling bonds are removed from the substrate 110 through the first passivation film 152 which is adjacent to the substrate 110. Specifically, hydrogen supplied to the substrate 110 through the first passivation film 152 combines with silicon (Si—H combination), thereby removing dangling bonds.

In the method of fabricating the image sensor of FIG. 11, the first passivation film 152 is formed especially adjacent to the substrate 110. That is, the first passivation film 152 is formed under the pad 194 and the blocking film 196. Since the first passivation film 152 is formed adjacent to the substrate 110, dangling bonds can be removed more effectively in the first annealing process which is performed to remove dangling bonds using the first passivation film 152.

Figure 21:
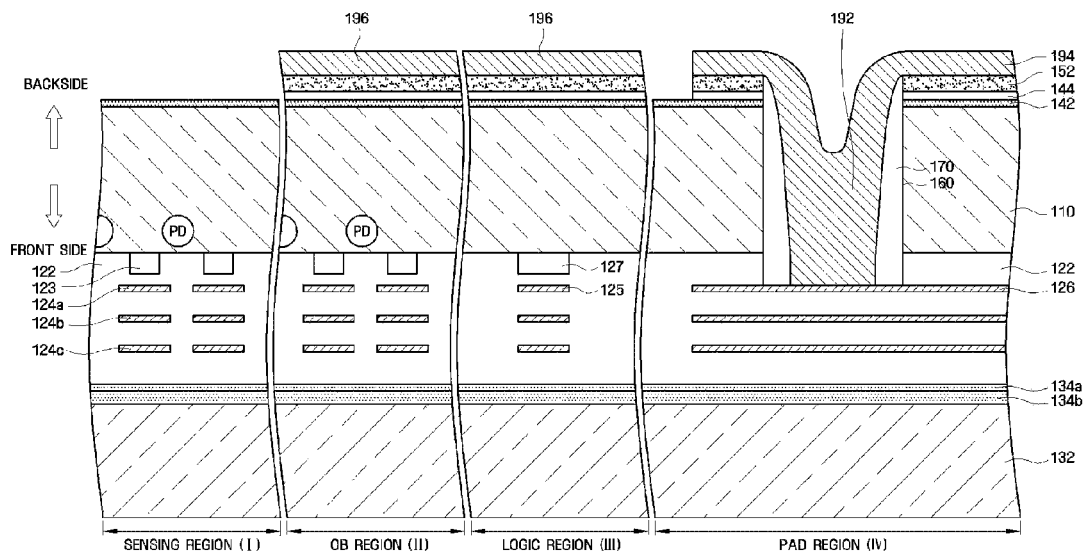
Figure 22:
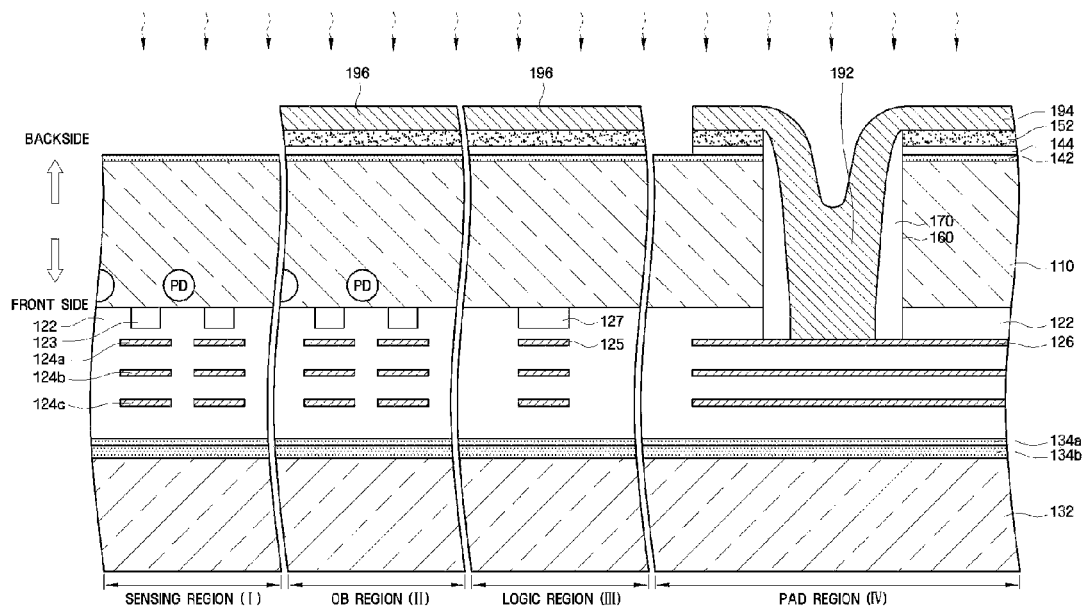

Referring to FIG. 21, exposed portions of the first passivation film 152 are removed using the conductive pattern (i.e., the contact 192, the pad 194 and the blocking film 196) as an etch mask. Here, the first passivation film 152 may be removed by an etch-back process. That is, the exposed portions of the first passivation film 152 may be removed without an additional photo process. After the exposed portions of the first passivation film 152 are removed, portions of the buffer film 144 may also be removed. Specifically, referring to FIG. 20, the first passivation film 152 is exposed in the sensing region I and in a portion of the pad region IV. Thus, when the first passivation film 152 exposed in the sensing region I and in a portion of the pad region IV is removed, the buffer film 144 is also removed. The first passivation film 152, which is made of SiN, does not have a high light transmittance. Thus, the first passivation film 152 in the sensing region I may be removed to prevent or reduce the deterioration of light reception efficiency. Referring to FIG. 22, a second annealing process is performed. The second annealing process may be an ultraviolet annealing process. In the second annealing process, the damage done to the substrate 110 during the etching of the first passivation film 152 is repaired.

In the method of fabricating the image sensor of FIG. 11, the first passivation film 152 is formed especially adjacent to the substrate 110. That is, the first passivation film 152 is formed under the pad 194 and the blocking film 196. Since the first passivation film 152 is formed adjacent to the substrate 110, dangling bonds can be removed more effectively in the first annealing process which is performed to remove dangling bonds using the first passivation film 152. In addition, the first annealing process may be performed after the first passivation film 152 is formed. Then, the second annealing process may be performed after the pad 194 and the blocking film 196 are formed on the first passivation film 152 and the first passivation film 152 in the sensing region I is exposed. That is, since an annealing process is divided into two rounds and performed accordingly, the damage done to the substrate 110 during the fabrication process of the image sensor can be repaired more effectively.

In the method of fabricating the image sensor of FIG. 11, a photo process is required only once to form the conductive pattern (i.e., the contact 192, the pad 194 and the blocking film 196). However, the photo process is not required to pattern the first passivation film 152, because a portion of the first passivation film 152 can be removed in an etch-back process by using the conductive pattern as an etch mask. Therefore, the backside of the image sensor can be fabricated in a smaller number of photo processes. That is, since the number of expensive photo processes can be reduced, costs can be reduced, thereby increasing productivity.

Figure 23:
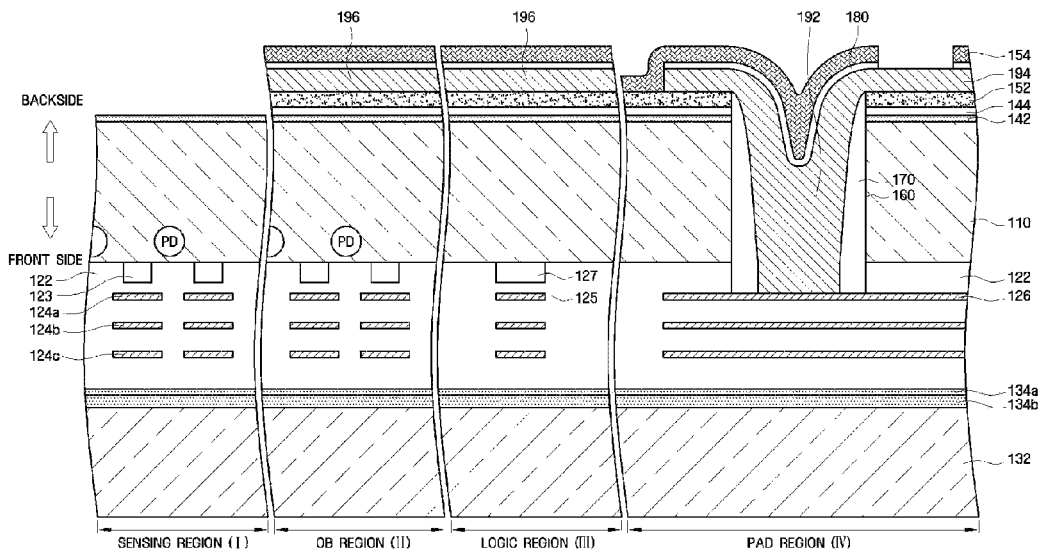
FIG. 23 is a cross-sectional view of an image sensor according to another example embodiment of the inventive concepts.

Hereinafter, an image sensor according to another example embodiment of the inventive concepts will be described with reference to FIG. 23. FIG. 23 is a cross-sectional view of an image sensor according to another example embodiment of the inventive concepts. Referring to FIG. 23, the image sensor according to the current example embodiment of the inventive concepts further includes a second passivation film 154 formed on a conductive pattern. The second passivation film 154 is not formed in a sensing region I and is formed on a blocking film 196 in an OB region II and a logic region III. In a pad region IV, the second passivation film 154 is formed on a pad 194 to expose a portion of a top surface of the pad 194.

Hereinafter, a method of fabricating the image sensor of FIG. 23 will be described with reference to FIGS. 12 through 18 and 23 through 28. FIGS. 24 through 28 are views for explaining a method of fabricating the image sensor of FIG. 23. Referring to FIGS. 12 through 18, as in the methods of fabricating the image sensors according to the previous example embodiments of the inventive concepts, in the method of fabricating the image sensor according to the current example embodiment of the inventive concepts, a reflection reducing film 142, a buffer film 144, and a first passivation film 152 are formed on a substrate 110, and a contact hole 160 is formed in the pad region IV. Thus, a detailed description of the above processes will be omitted.

Figure 24:
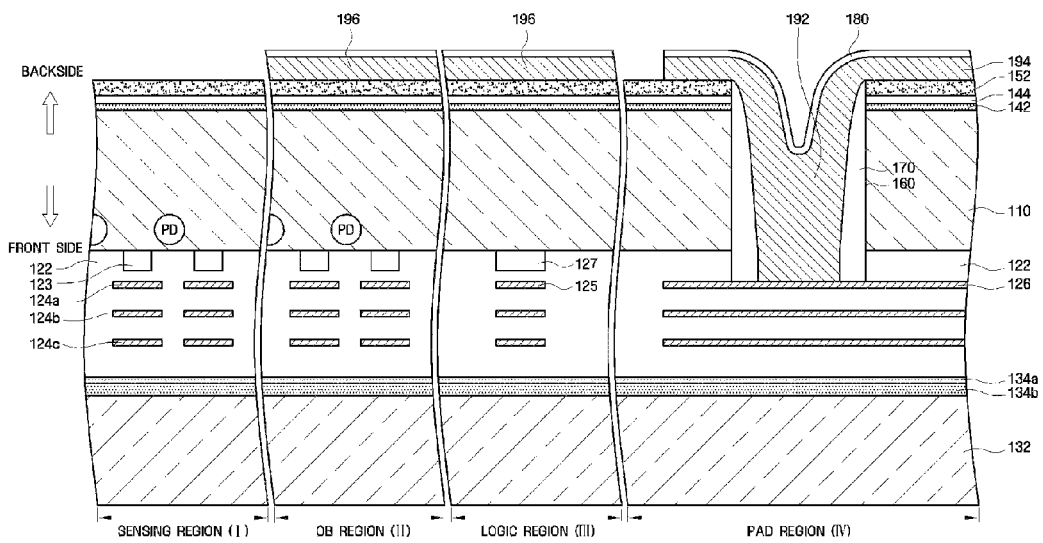
FIGS. 24 through 28 are views for explaining a method of fabricating the image sensor of FIG. 23.

Referring to FIG. 24, the conductive pattern, which includes a contact 192, the pad 194, and the blocking film 196, is formed. That is, the contact 192 and the pad 194, which fill the contact hole 160 and thus are electrically connected to a first metal wiring layer 126, are formed in the pad region IV, and the blocking film 196, which blocks light, is formed in the OB region II and the logic region III.

Specifically, a conductive material (not shown) and an oxide material (not shown) are conformally formed along the first passivation film 152 and an insulating spacer 170 and then patterned, thereby forming the conductive pattern and forming an oxide film pattern 180 on the conductive pattern. In the current example embodiment of the inventive concepts, the contact 192 and the pad 194 are formed simultaneously. However, the inventive concepts are not limited thereto. When necessary, the contact 192, which is electrically connected to the first metal wiring layer 126, may be formed by a separate process. Then, the pad 194, which is electrically connected to the contact 192, may be formed.

Figure 25:
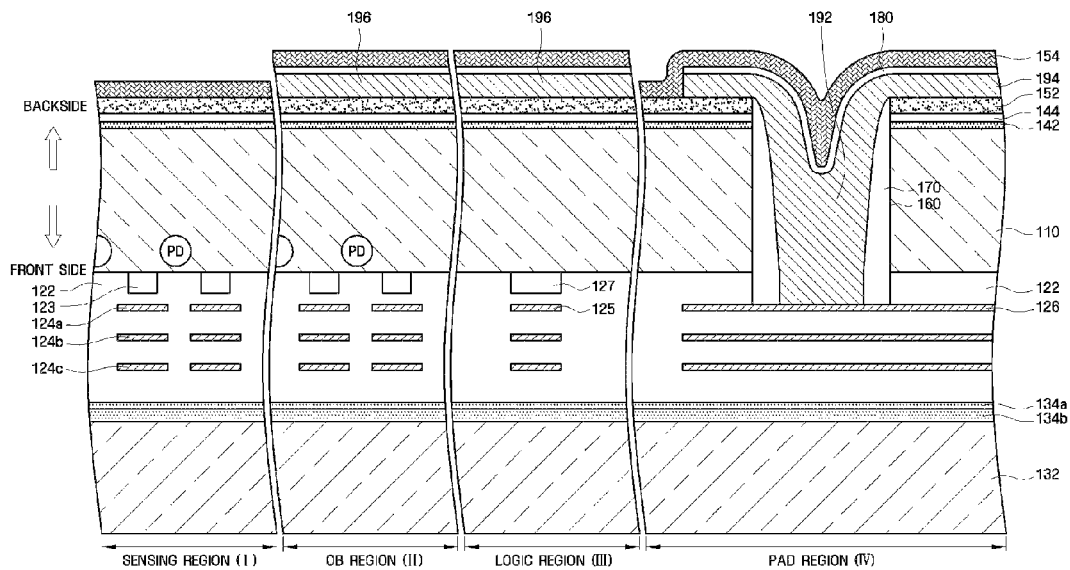

Referring to FIG. 25, the second passivation film 154 is formed on the substrate 110 having the conductive pattern (i.e., the contact 192, the pad 194, and the blocking film 196). The second passivation film 154 may cover the entire surface of the substrate 110 and may be a silicon nitride film, that is, may be formed by depositing SiN using the PECVD method.

Figure 26:
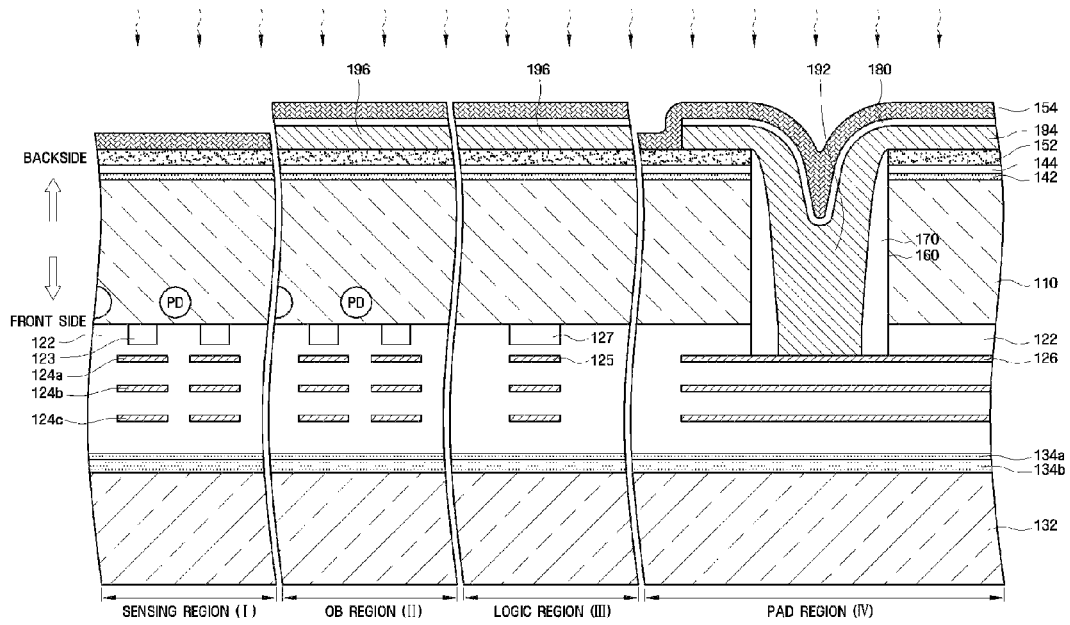

Referring to FIG. 26, a first annealing process is performed. In the first annealing process, dangling bonds are removed from the substrate 110 through the first passivation film 152 and the second passivation film 154. Specifically, hydrogen supplied to the substrate 110 through the first passivation film 152 and the second passivation film 154 combines with silicon (Si—H combination), thereby removing dangling bonds.

In the method of fabricating the image sensor of FIG. 23, the first passivation film 152 is formed especially adjacent to the substrate 110. That is, the first passivation film 152 is formed under the pad 194 and the blocking film 196. Since the first passivation film 152 is formed adjacent to the substrate 110, dangling bonds can be removed more effectively in the first annealing process which is performed to remove dangling bonds using the first passivation film 152.

In addition, since the first passivation film 152 is formed under the pad 194 and the blocking film 196 and the second passivation film 154 is formed on the conductive pattern, the damage done to a portion of the substrate 110 during the patterning of the conductive pattern can be repaired more effectively.

Figure 27:
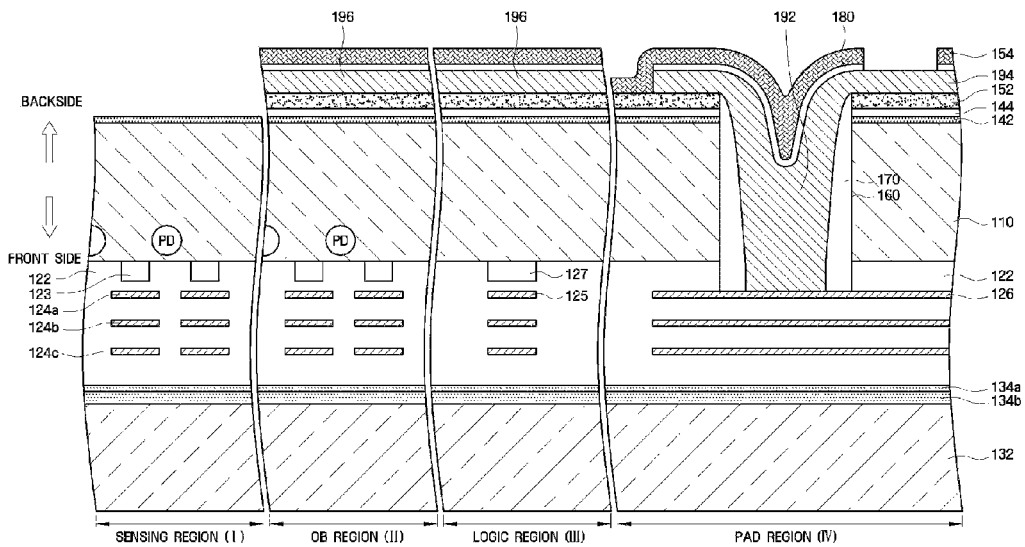

Referring to FIG. 27, the first and second passivation films 152 and 154 are patterned. Specifically, portions of the first and second passivation films 152 and 154 is removed by a photolithography process. Here, the first and second passivation films 152 and 154 in the sensing region I are all removed, and a portion of the second passivation film 154 in the pad region IV is removed to partially expose the pad region IV.

That is, the first and second passivation films 152 and 154 are all removed from the sensing region I by the patterning process, thereby increasing light transmittance. On the other hand, the first passivation film 152, the blocking film 196, and the second passivation film 154 are sequentially stacked in the OB region II and the logic region III, thereby completely blocking light. In the pad region IV, the pad 194 is formed on the first passivation film 152, and the second passivation film 154 is formed on the pad 194. Here, a portion of the second passivation film 154 is removed such that the pad 194 can be connected to an external terminal.

Figure 28:
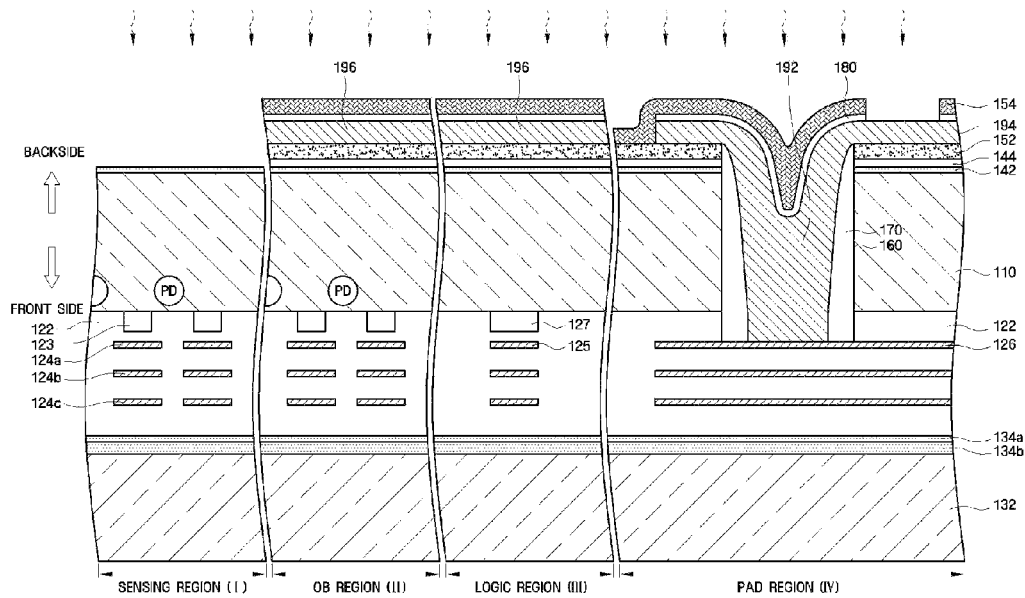

Referring to FIG. 28, a second annealing process is performed. The second annealing process may be an ultraviolet annealing process. In the second annealing process, the damage done to the substrate 110 during the fabrication of the image sensor, in particular, the damage done to the substrate 110 during the patterning of the first and second passivation films 152 and 154 can be repaired.

Figure 29:
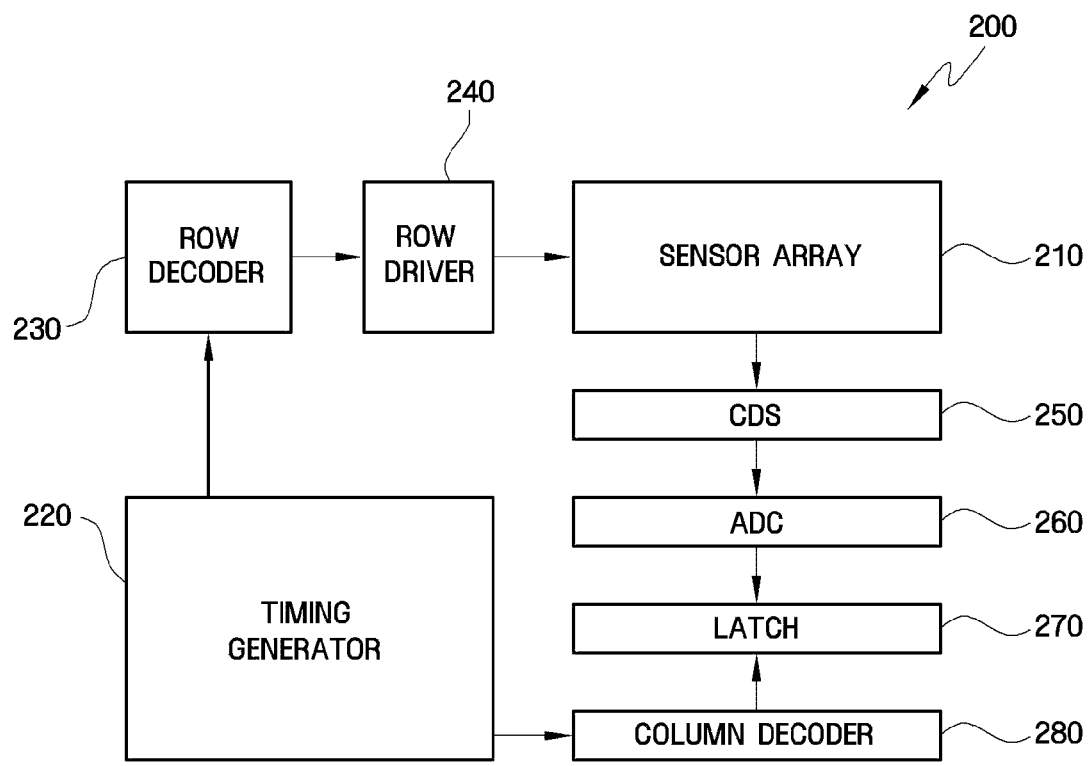
FIG. 29 is a block diagram of a chip which embodies an image sensor according to example embodiments of the inventive concepts.
Figure 30:
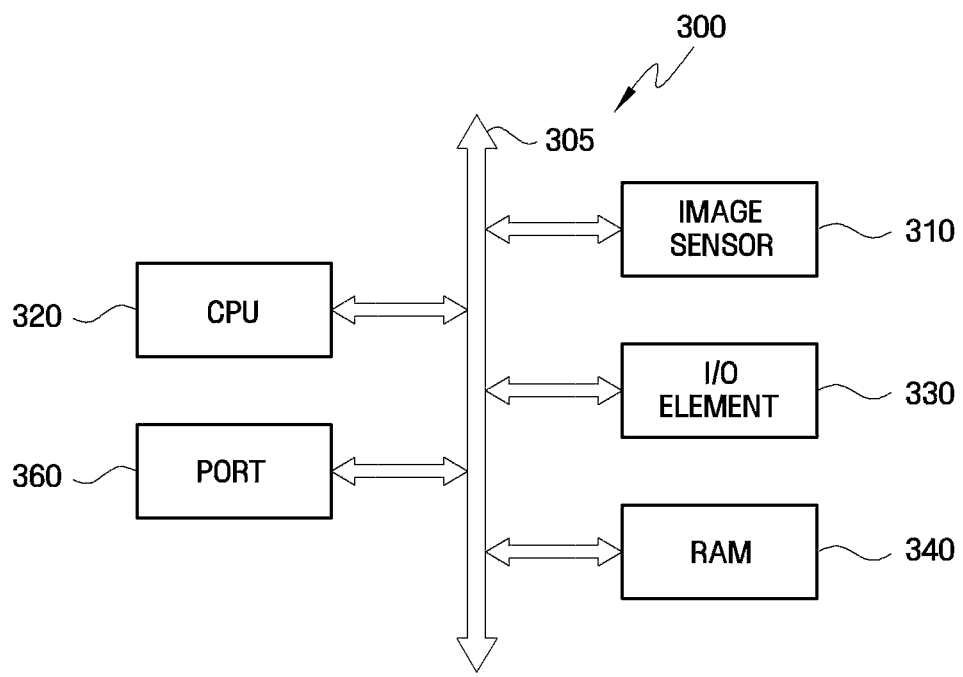
FIGS. 30 through 32 are diagrams illustrating processor-based apparatuses including an image sensor according to example embodiments of the inventive concepts.

Hereinafter, apparatuses using an image sensor according to example embodiments of the inventive concepts will be described with reference to FIGS. 29 through 32. FIG. 29 is a block diagram of a chip 200 which embodies an image sensor according to example embodiments of the inventive concepts. FIGS. 30 through 32 are diagrams illustrating processor-based apparatuses including an image sensor according to example embodiments of the inventive concepts.

Figure 31A:
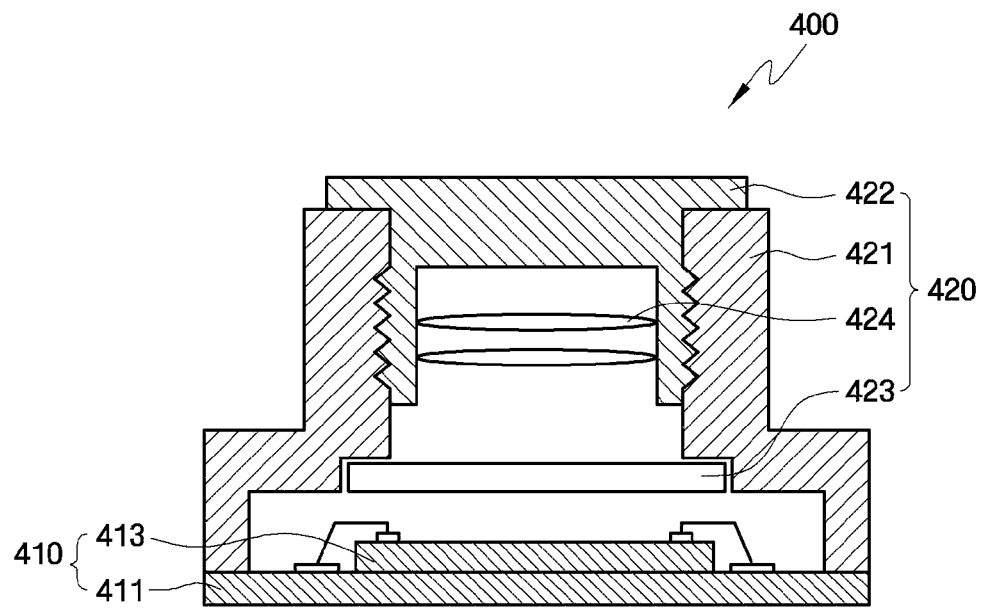
Figure 31B:
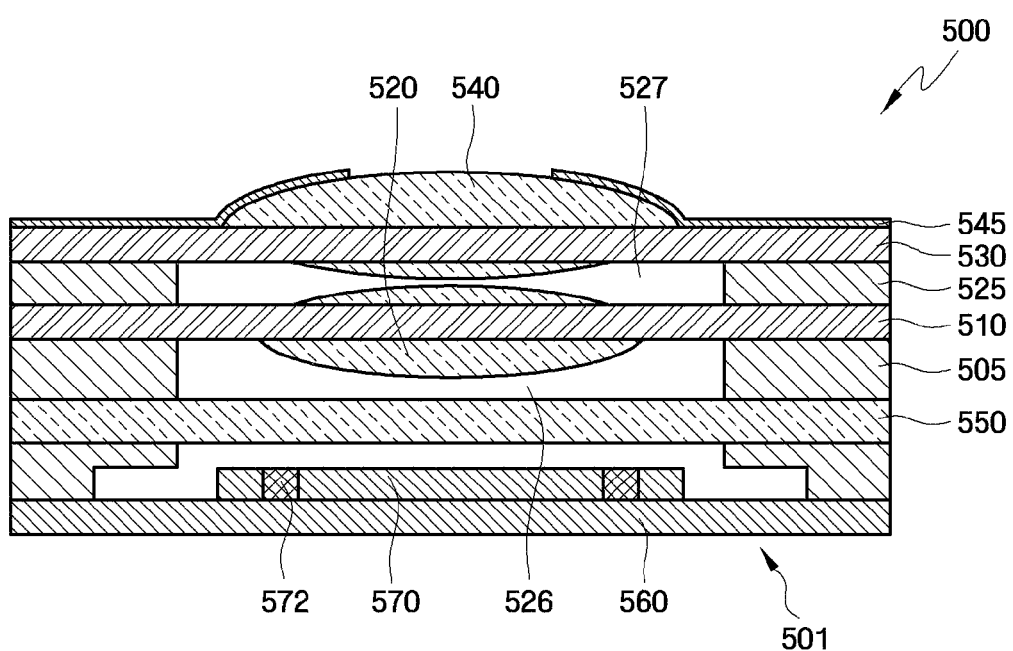
Figure 32:
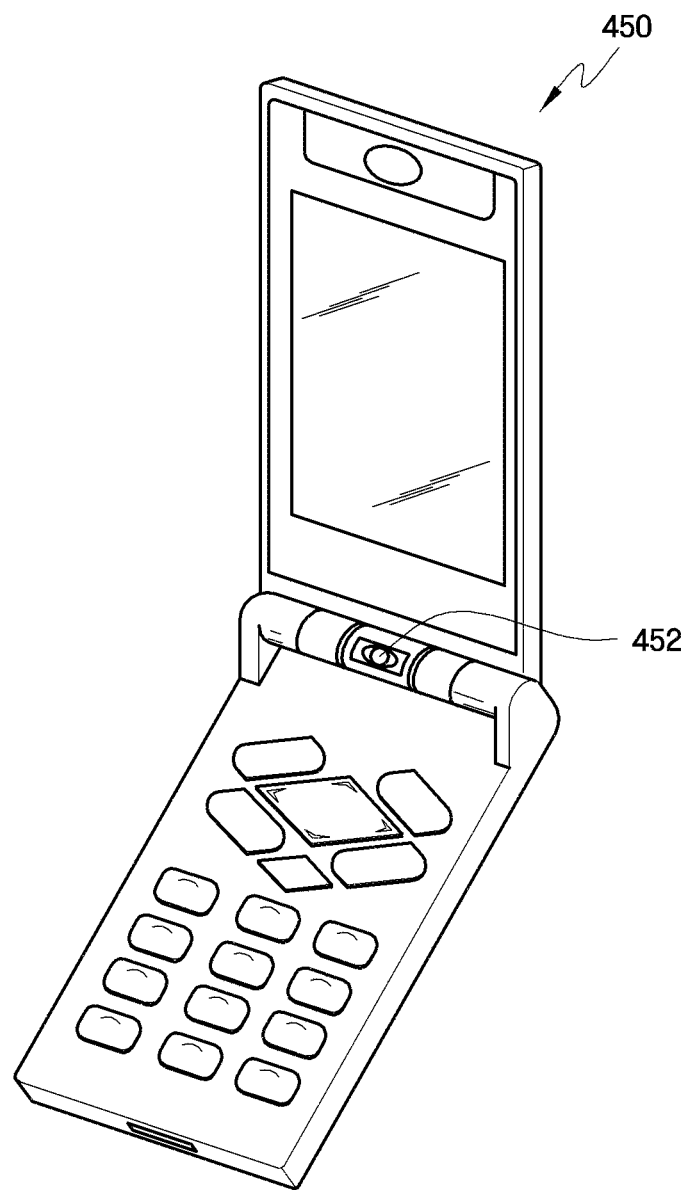

Specifically, FIG. 30 illustrates a computer 300, FIGS. 31A and 31B illustrate cameras 400 and 500, and FIG. 32 illustrates a mobile phone 450. It is obvious to those of ordinary skill in the art that an image sensor according to example embodiments of the inventive concepts can be used in apparatuses (such as scanners, mechanized clock apparatuses, navigation apparatuses, videophones, surveillance apparatuses, automatic focusing apparatuses, tracking apparatuses, motion detection apparatuses, and image stabilization apparatuses) other than the above apparatuses.

Referring to FIG. 29, the chip 200 which embodies an image sensor according to example embodiments of the inventive concepts includes a sensor array 210 composed of pixels which include light sensing elements and are arranged two-dimensionally, a timing generator 220, a row decoder 230, a row driver 240, a correlated double sampler (CDS) 250, an analog-to-digital converter (ADC) 260, a latch 270, and a column decoder 280.

The sensor array 210 includes a plurality of unit pixels that are arranged two-dimensionally. The unit pixels convert an optical image into an electrical signal. The sensor array 210 is driven by a plurality of driving signals (such as a row selection signal, a reset signal, and a charge transfer signal) transmitted from the row driver 240. In addition, the sensor array 210 transmits the electrical signal to the CDS 250 via a vertical signal line.

The timing generator 220 provides a timing signal and a control signal to the row decoder 230 and the column decoder 280. The row driver 240 transmits a plurality of driving signals for driving the unit pixels to the sensor array 210 based on the decoding result of the row decoder 230. When the unit pixels are arranged in a matrix form, the row driver 240 may transmit a driving signal to each row of unit pixels.

The CDS 250 receives the electrical signal from the sensor array 210 via the vertical signal line and holds and samples the received electrical signal. That is, the CDS 250 samples a noise level and a signal level of the electrical signal and outputs the difference between the noise level and the signal level of the electrical signal.

The ADC 260 converts an analog signal, which corresponds to the difference between the noise level and the signal level of the electrical signal, into a digital signal and outputs the digital signal. The latch 270 latches the digital signal. Latched signals are sequentially provided to an image signal processor (not shown) based on the decoding result of the column decoder 280. All functional blocks illustrated in FIG. 29 may be formed as one chip or a plurality of chips. For example, the timing generator 220 may be formed as a separate chip, and the other chips may be integrated into a single chip. Also, these chips may be implemented in the form of a package.

Referring to FIG. 30, the computer 300 includes a central processing unit (CPU) 320 (e.g., a microprocessor) which can communicate with an input/output element 330 via a bus 305. An image sensor 310 may communicate with other components of the computer 300 via the bus 305 or any other telecommunication link. The computer 300 may further include a random access memory (RAM) 340 and/or a port 360 which can communicate with the CPU 320 via the bus 305.

The port 360 may allow a video card, a sound card, a memory card, or a universal serial bus (USB) element to be coupled to the computer 300 and allow the computer 300 to perform data communication with other apparatuses. The image sensor 310 may be integrated together with the CPU 320, a digital signal processor (DSP), or a microprocessor. Also, the image sensor 310 may be integrated together with a memory. When necessary, the image sensor 310 and a processor may be integrated on different chips.

Referring to FIG. 31A, the camera 400 includes an image sensor package 410 in which an image sensor 413 is mounted onto a circuit board 411 by bonding wires. In addition, a housing 420 is attached onto the circuit board 411 and protects the circuit board 411 and the image sensor 413 from an external environment.

An optical tube assembly 421, through which an image to be captured passes, may be formed in the housing 420. Also, a protective cover 422 may be installed at an outer end of the optical tube assembly 421, and an infrared-blocking and reflection-reducing filter 423 may be installed at an inner end of the optical tube assembly 421. Further, a lens 424 may be installed inside the optical tube assembly 421 and move along the screw thread of the optical tube assembly 421.

Referring to FIG. 31B, the camera 500 includes an image sensor package 501 which uses through vias 572. The through vias 572 enable an image sensor 570 and a circuit board 560 to electrically contact each other without wire bonding. A first lens 520, a second lens 540, lens components 526 and 527, support members 505 and 525, an aperture 545, transparent substrates 510 and 530, and a pane of glass 550 shown in FIG. 31B will not be described.

Referring to FIG. 32, an image sensor 452 is attached to a predetermined or given position on the mobile phone 450. It is obvious to those of ordinary skill in the art that the image sensor 452 can also be attached to positions other than the position shown in FIG. 32.

While the inventive concepts has been particularly shown and described with reference to example embodiments of the inventive concepts thereof, it will be understood by those of ordinary skill in the art that various changes in form and detail may be made therein without departing from the spirit and scope of the inventive concepts as defined by the following claims. Example embodiments of the inventive concepts should be considered in a descriptive sense only and not for purposes of limitation.

What is claimed is:

1. A method of fabricating an image sensor, the method comprising:
    forming a plurality of photoelectric conversion units in a substrate, the plurality of photoelectric conversion units separated from each other by a plurality of isolation regions;
    forming an insulating structure on the substrate, the insulating structure including a plurality of metal wiring layers;
    bonding a support substrate to a first surface of the substrate;
    etching a second surface of the substrate;
    partially exposing the plurality of metal wiring layers by forming a contact hole penetrating the substrate and a portion of the insulating structure;
    forming an insulating spacer on the sidewalls of the contact hole, the insulating spacer directly contacting the plurality of metal wiring layers;
    forming a conductive spacer on the insulating spacer, the conductive spacer electrically connected to the exposed metal wiring layers; and
    forming a conductive pattern on the second surface of the substrate, the conductive pattern including a pad and a contact, the pad electrically connected to the exposed metal wiring layers.

2. The method of claim 1, wherein the forming a conductive spacer step comprises:
    forming a conductive layer on the substrate by a CVD process; and
    forming the conductive spacer by etching a portion of the conductive layer using an etch-back process or a chemical mechanical polishing (CMP) process.

3. A method of fabricating an image sensor, the method comprising:
    providing a substrate including a pad region, an OB region, and a sensing region;
    forming an insulating structure including a metal wiring layer on a first surface of the substrate;
    forming a first passivation film on a second surface of the substrate;
    exposing a portion of the metal wiring layer in the pad region by forming a contact hole penetrating the first passivation film and the substrate; and
    forming a conductive pattern on the first passivation film,
    the conductive pattern including:
    a pad electrically connected to the metal wiring layer via a contact directly contacting the metal wiring layer on a bottom surface of the contact hole, the pad and the contact forming an integral structure, and
    a blocking film formed in the OB region at a same height as the pad to cover the OB region.

4. The method of claim 3, further comprising:
    performing a first annealing process to remove dangling bonds from the substrate after the forming a conductive pattern step;
    forming a buffer film on the etched second surface of the substrate before the forming a first passivation film step;
    etching a portion of the first passivation film to expose a portion of the buffer film after the performing a first annealing process step; and
    performing a second annealing process after the etching a portion of the first passivation film step.

5. The method of claim 3, further comprising:
    forming a buffer film on the etched second surface of the substrate before the forming a first passivation film step;
    forming a second passivation film on the substrate after the forming a conductive pattern step;
    performing a first annealing process after the forming a second passivation film step;
    etching portions of the first and second passivation films to form a contact hole which exposes a portion of the buffer film and exposes a portion of the pad; and
    performing a second annealing process after the etching portions of the first and second passivation films step.

6. The method of claim 3, wherein a logic region is further defined in the substrate, and the blocking film is further formed in the logic region when the blocking film is formed in the OB region.

7. The method of claim 3, wherein the forming a conductive pattern step comprises:
    forming a conductive film on the entire second surface of the substrate; and
    patterning the conductive film to form the pad in the pad region and form the blocking film in the OB region such that a top surface of the sensing region is exposed.

8. The method of claim 3, further comprising:
    bonding a support substrate onto the insulating structure and etching the second surface of the substrate after the forming an insulating structure on the first surface of the substrate step, wherein the first passivation film is formed on the etched second surface of the substrate.

9. A method of fabricating an image sensor, the method comprising:
    providing a semiconductor substrate;
    forming an insulating structure on the semiconductor substrate, the insulating structure including a metal wiring layer;
    bonding a support substrate to a first surface of the semiconductor substrate;
    etching a second surface of the semiconductor substrate;
    forming a first passivation film on the etched second surface of the semiconductor substrate;
    exposing a portion of the metal wiring layer by forming a contact hole penetrating the first passivation film and the substrate;
    forming a conductive pattern on the first passivation film, the conductive pattern including a pad electrically connected to the metal wiring layer via a contact directly contacting the metal wiring layer on a bottom surface of the contact hole, the pad and the contact forming an integral structure, and the pad configured to input or output external signals; and
    performing a first annealing process to remove dangling bonds from the semiconductor substrate.

10. The method of claim 9, further comprising:
    forming a buffer film on the etched second surface of the semiconductor substrate before the forming a first passivation film step;
    etching a portion of the first passivation film using an etch-back process to expose a portion of the buffer film after the performing a first annealing process step; and
    performing a second annealing process after the etching a portion of the first passivation film step.

* * * * *